United States Patent
Tokai

(10) Patent No.: US 10,903,832 B2
(45) Date of Patent: Jan. 26, 2021

(54) CURRENT DRIVE CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yoichi Tokai, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 44 days.

(21) Appl. No.: 16/298,609

(22) Filed: Mar. 11, 2019

(65) Prior Publication Data
US 2019/0296733 A1 Sep. 26, 2019

(30) Foreign Application Priority Data

Mar. 22, 2018 (JP) .................................. 2018-055292
Feb. 27, 2019 (JP) .................................. 2019-034836

(51) Int. Cl.
*G05F 3/26* (2006.01)
*H03K 17/10* (2006.01)
*H03K 17/082* (2006.01)
*H05B 45/37* (2020.01)

(52) U.S. Cl.
CPC ............. *H03K 17/102* (2013.01); *G05F 3/26* (2013.01); *G05F 3/262* (2013.01); *H03K 17/082* (2013.01); *H05B 45/37* (2020.01)

(58) Field of Classification Search
CPC ........... H03K 17/102; H03K 19/00315; H03K 17/082; H03K 17/145; H05B 45/37; G05F 3/26; G05F 3/262; Y02B 20/30
USPC .......................................................... 307/112
See application file for complete search history.

(56) References Cited

U.S. PATENT DOCUMENTS

| 5,796,767 A * | 8/1998 | Aizawa | H05B 45/00 372/38.02 |
| 8,686,667 B2 | 4/2014 | Mishima et al. | |
| 2008/0068066 A1* | 3/2008 | Mittal | H05B 45/46 327/535 |

(Continued)

FOREIGN PATENT DOCUMENTS

| JP | 2011155746 A | 8/2011 |
| JP | 2011249760 A | 12/2011 |
| JP | 2012248588 A | 12/2012 |

*Primary Examiner* — Ryan Jager
(74) *Attorney, Agent, or Firm* — Holtz, Holtz & Volek PC

(57) ABSTRACT

A current drive circuit has a first transistor that outputs a current, a second transistor connected to the first transistor by cascode connection, a third transistor connected to the second transistor by cascode connection, a first current source that supplies a current to the third transistor and the second transistor, a fourth transistor that shares a gate with the third transistor, a fifth transistor that is connected to the fourth transistor by cascode connection and shares a gate with the second transistor, a second current source that supplies a current to the fourth transistor and the fifth transistor, a sixth transistor that shares a gate with the third transistor and the fourth transistor and controls a gate voltage of the first transistor, and a third current source that supplies a drain current of the sixth transistor.

15 Claims, 34 Drawing Sheets

(56) References Cited

U.S. PATENT DOCUMENTS

2008/0284471 A1* 11/2008 Kobayashi ............ H05B 45/14
    327/109
2012/0025737 A1* 2/2012 Kikuchi ................ H03F 3/087
    315/307

* cited by examiner

US 10,903,832 B2

CURRENT DRIVE CIRCUIT

CROSS REFERENCE TO RELATED APPLICATIONS

This application is based upon and claims the benefit of priority from the prior Japanese Patent Applications No. 2018-55292 filed on Mar. 22, 2018 and No. 2019-34836 filed on Feb. 27, 2019, the entire contents of which are incorporated herein by reference.

FIELD

An embodiment of the present invention relates to a current drive circuit.

BACKGROUND

A light emitting device (LED) used for backlight or the like of a liquid crystal panel changes color rendering depending on the magnitude of a carried current. Therefore, in order to emit light with expected color rendering, it is required to control a current applied to the LED with high accuracy. The LED that emits light with the controlled current is dimmed with pulse width modulation of a current applied to the LED. A pulsed current frequency within the human audible range may contribute to the generation of an unpleasant sound in a power supply circuit or the like. To solve the problem, a frequency of an LED is often set to a level in the ultrasonic range which is much higher than a frequency of a commercially used power supply. Furthermore, in order to obtain required luminous intensity, a plurality of LEDs needs to be driven in series, which may require a drive power output voltage of several tens V or more.

Driving an LED on or off by pulse width modulation greatly fluctuates the voltage at an LED connection terminal of a current drive circuit that supplies a current to the LED. However, so as not to affect color rendering and dimming, even with great fluctuations of the output voltage, it is desirable to keep the accuracy of the output current of the current drive circuit.

DETAILED DESCRIPTION

Figure 1A:
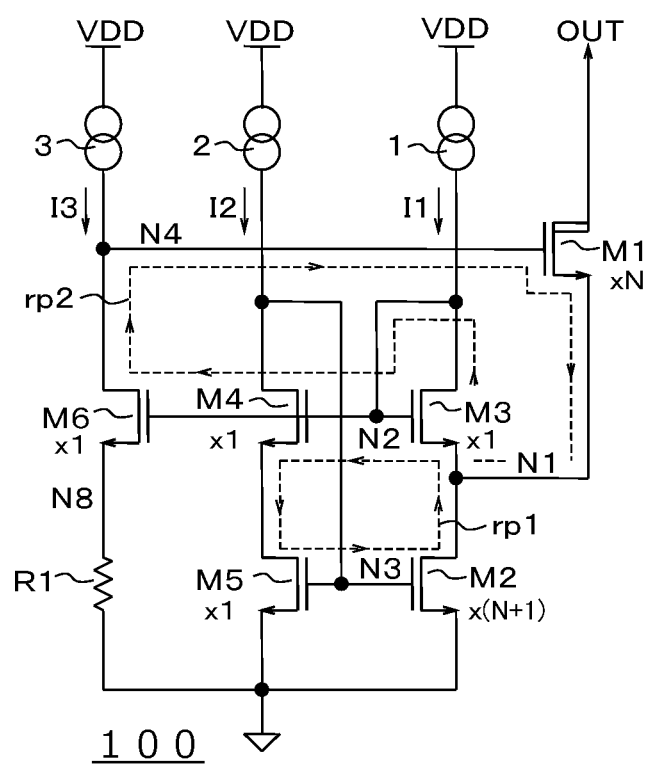
FIG. 1A is a circuit diagram of a current drive circuit according to a first embodiment.

According to one embodiment, a current drive circuit has a first transistor that outputs a current, a second transistor connected to the first transistor by cascode connection, a third transistor connected to the second transistor by cascode connection, a first current source that supplies a current to the third transistor and the second transistor, a fourth transistor that shares a gate with the third transistor, a fifth transistor that is connected to the fourth transistor by cascode connection and shares a gate with the second transistor, a second current source that supplies a current to the fourth transistor and the fifth transistor, a sixth transistor that shares a gate with the third transistor and the fourth transistor and controls a gate voltage of the first transistor, and a third current source that supplies a drain current of the sixth transistor.

Hereinafter, an embodiment of this disclosure will be described with reference to the drawings. In the drawings attached to this description, for the sake of easy understanding and simple illustration, scale ratios as well as longitudinal and lateral dimensional ratios are exaggerated and changed from the actual ones in an appropriate manner.

Herein, in regard to the terms such as "parallel", "vertical", and "similar" that specify shapes, geometrical conditions, and degrees thereof and in regard to values of lengths and angles, those are interpreted as including a range that promises to offer similar functions without being bound in the strict sense.

First Embodiment

Figure 1B:
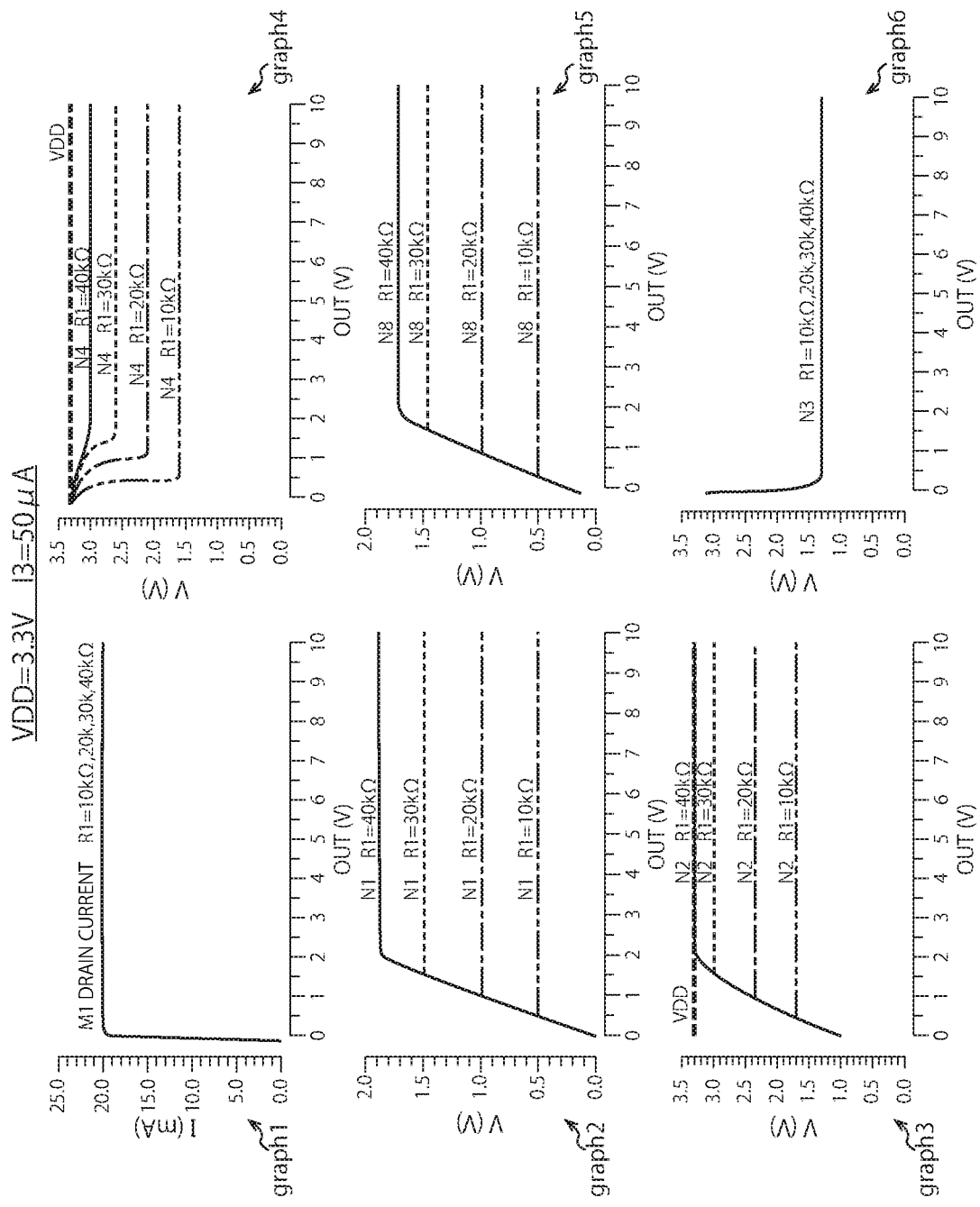
FIG. 1B is a graph showing electrical characteristics in the current drive circuit of FIG. 1A.

FIG. 1A is a circuit diagram of a current drive circuit 100 according to a first embodiment. The current drive circuit 100 in FIG. 1A is built into, for example, an LED driver but is not limited to the application of driving the LED. FIG. 1B is a graph (graph1 to graph6) showing electrical characteristics in the current drive circuit 100 of FIG. 1A. In graph1 to graph6, the output voltage (V) is taken along the abscissa. In graph1, the drain current of a first transistor M1 is taken along the ordinate. In graph2 to graph6, the voltage (V) at N1, N2, N4, N8, and N3 is taken along the ordinate, respectively.

The current drive circuit 100 of FIG. 1A is configured to drive the first transistor M1 having a high withstand voltage with respect to current output. The current drive circuit 100 of FIG. 1A includes second to sixth transistors M2 to M6 having a withstand voltage lower than that of the first transistor M1 and includes first to third current sources 1 to 3. In FIG. 1A, the first to sixth transistors M1 to M6 are illustrated as being n-type metal-oxide-silicon (MOS) transistors but may also be p-type MOS transistors.

In a case where the first to sixth transistors M1 to M6 are p-type MOS transistors, a relation of connection of each transistor between a power supply voltage node VDD and a ground node is opposite to the relation of connection illustrated in FIG. 1A. A drain of the first transistor M1 is connected to an output terminal OUT, and a constant current is output from the output terminal OUT. Herein, the first to sixth transistors M1 to M6 are illustrated as being n-type MOS transistors. It should be noted that the first transistor M1 is not necessarily required to have a high withstand voltage and may have the same withstand voltage or a lower withstand voltage compared with the second to sixth transistors M2 to M6.

The second transistor M2 is connected to the first transistor M1 by cascode connection. The third transistor M3 is connected to the second transistor M2 by cascode connection. The first current source 1 supplies a current to the third transistor M3 and the second transistor M2. The first current source 1 is interposed between the power supply voltage node VDD and a drain of the third transistor M3. A source of the third transistor M3 is connected to a drain of the second transistor M2, and a source of the second transistor M2 is connected to the ground node. A gate and the drain of the third transistor M3 are connected to each other.

The fourth transistor M4 shares the gate with the third transistor M3. The fifth transistor M5 is connected to the fourth transistor M4 by cascode connection. The second current source 2 supplies a current to the fourth transistor M4 and the fifth transistor M5. The second current source 2 is interposed between the power supply voltage node VDD and a drain of the fourth transistor M4. A source of the fourth transistor M4 is connected to a drain of the fifth transistor M5, and a source of the fifth transistor M5 is connected to the ground node. A gate of the fifth transistor M5 and the drain of the fourth transistor M4 are connected to each other.

The sixth transistor M6 shares the gate with the third transistor M3 and the fourth transistor M4. The sixth transistor M6 controls a gate voltage of the first transistor M1. The third current source 3 supplies a current to the sixth transistor M6. The third current source 3 is interposed between the power supply voltage node VDD and a drain of the sixth transistor M6. The drain of the sixth transistor M6 is connected to the gate of the first transistor M1. A resistor R1 is connected, for example, between a source of the sixth transistor M6 and the ground node.

The second transistor M2 is (N+1) times the size of the third to sixth transistors M3 to M6. N represents, for example, a value of several tens to several thousands. The size of the first transistor M1 is also sufficiently large. In FIG. 1A, the size of the first transistor M1 is denoted by "×N", but the first transistor M1 may be larger than the second transistor M2 in size.

In FIG. 1A, a connection node between the source of the first transistor M1 and the drain of the second transistor M2 is denoted by N1; the gate shared by the third transistor M3, the fourth transistor M4, and the sixth transistor M6 is denoted by N2; the gate shared by the second transistor M2 and the fifth transistors M5 is denoted by N3; the gate of the first transistor M1 is denoted by N4; and the source of the sixth transistor M6 denoted by N8.

The third transistor M3 and the fourth transistor M4 are included in a current mirror circuit so that the value (a gate width W/a gate length L) of the third transistor M3 per current I1 from the first current source 1 is equivalent to the value (a gate width W/a gate length L) of the fourth transistor M4 per current I2 from the second current source 2. The current I1 flows to the node N2 linked to the gate of the third transistor M3, and the current I2 flows to the node N3 linked to the gate of the second transistor M2.

When the value (a gate width W/a gate length L) of the sixth transistor M6 per current I3 from the third current source 3 is set to the value (a gate width W/a gate length L) of the third transistor M3 per current I1 from the first current source 1, as shown in graph1, the saturation potential at N1 can be set to a product of the resistor R1 and a current I3, with respect to the saturation potential at N8.

The saturation potentials at N1 and N8 become almost the same potential due to a feedback loop rp2. As a necessary condition therefor, N2 and N4 relating to N1 and N8 have to be set not to saturate in the vicinity of the power supply voltage VDD.

Figure 1C:
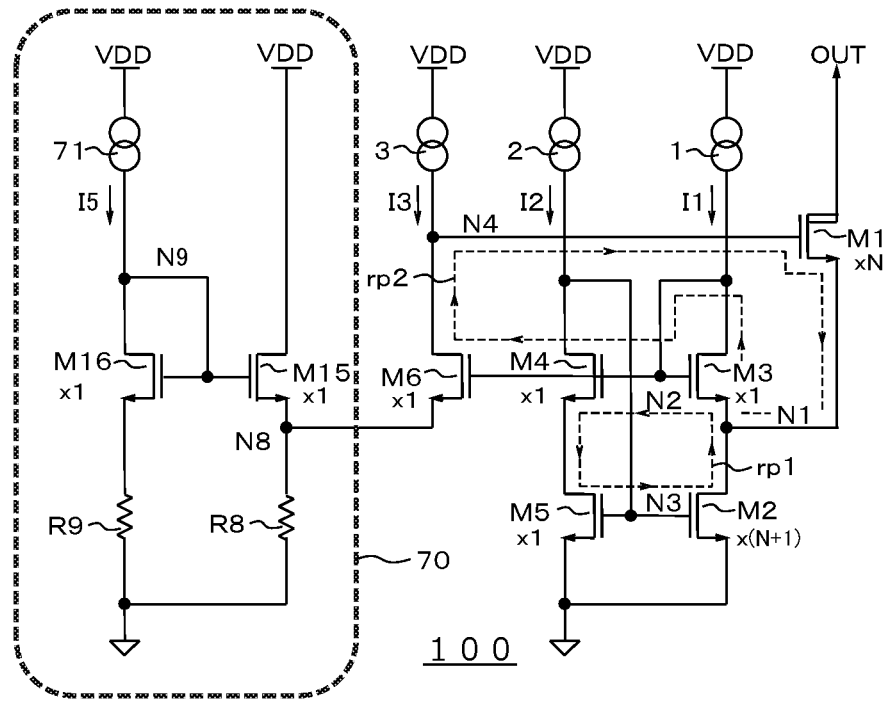
FIG. 1C is a circuit diagram showing a modification of the circuit of FIG. 1A.

FIG. 1C is a circuit diagram showing a modification of the circuit of FIG. 1A. FIG. 1C is a circuit example which shortens the time until N4 becomes stable with the feedback of the loop rp2 by raising the potential at N8 by a source follower circuit 70 when the N4 potential is raised again or just after restarting the current supply. The source follower circuit 70 includes transistors M15 and M16 that configure a current mirror circuit, a resistor R8 connected between the source of the transistor M15 and a ground node, a resistor R9 connected between the source of the transistor M16 and the ground node, and a current source 71 connected between the drain of the transistor M16 and a power supply VDD. The source of the transistor M15 is connected to the source of the transistor M6.

Figure 1D:
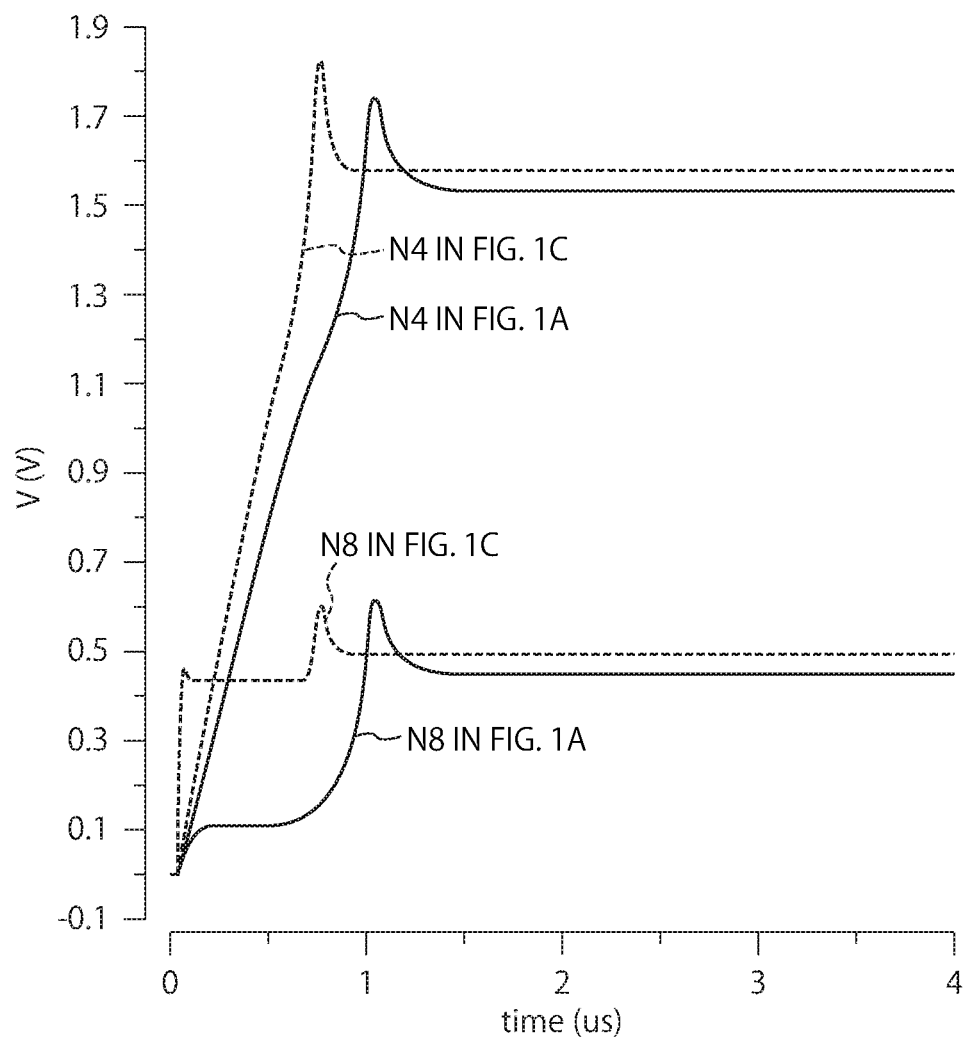
FIG. 1D is a view illustrating waveforms at N4 and N8 in the circuits of FIGS. 1A and 1C.

FIG. 1D is a view illustrating waveforms at N4 and N8 in the circuits of FIGS. 1A and 1C. As shown in FIG. 1D, when N4 is at zero volts in the initial state, in the circuit of FIG. 1A, the N8 potential remains in the vicinity of 0.1 volts until the N4 potential exceeds the threshold voltage, whereas, in the circuit of FIG. 1C, the setting time is shortened by about 30% because the N8 potential is raised quickly to 0.4 volts or higher by the source follower circuit 70.

Figure 1E:
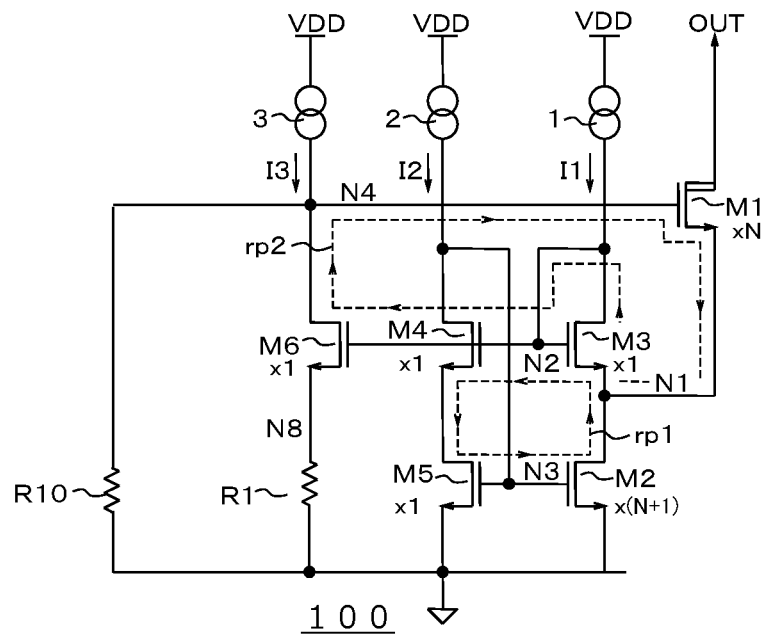
FIG. 1E is a circuit diagram showing another modification of the circuit of FIG. 1A.

FIG. 1E is a circuit diagram showing another modification of the circuit of FIG. 1A. FIG. 1E is a circuit diagram showing an example in which the N4 potential is pulled down with a resistor R10 so that an LED current is not generated when the power supply voltage VDD is insufficient. In FIG. 1E, the drain current of the sixth transistor M6 is reduced from I3 to I3−N4 potential/R10.

Figure 1F:
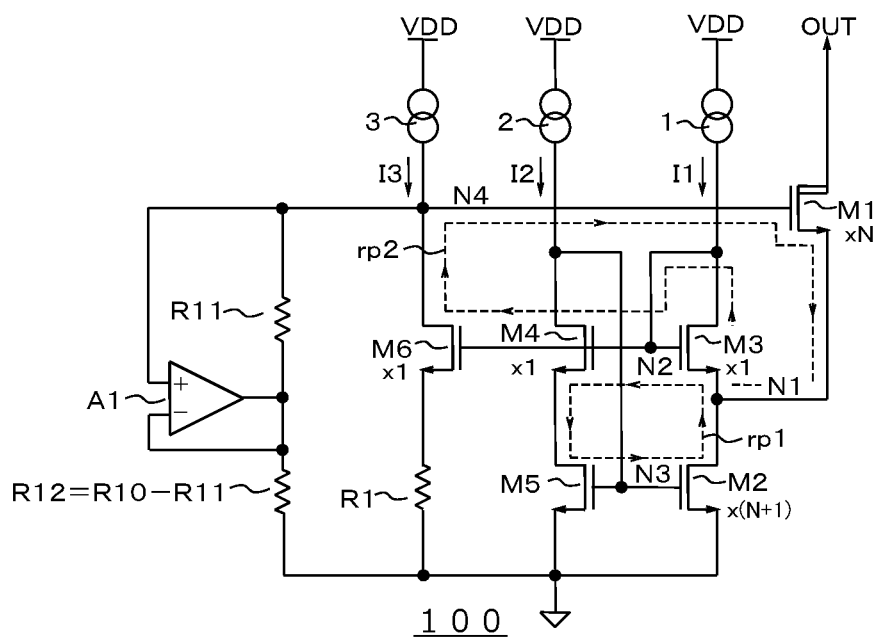
FIG. 1F is a circuit diagram showing still another modification of the circuit of FIG. 1A.

FIG. 1F is a circuit diagram showing still another modification of the circuit of FIG. 1A. FIG. 1F shows a circuit example that compensates for the decrease in the N4 potential due to the resistor R10 of FIG. 1E with a buffer amplifier A1. That is, since the N4 potential decrease too much in the circuit of FIG. 1E, the buffer amplifier A1 operates to raise the N4 potential. A resistor R11 is connected between the output node of the buffer amplifier A1 and N4, and a resistor R12 is connected between the output node of the buffer amplifier A1 and a ground node. The resistor R12 is set to have resistance R12=R10−R11.

Figure 2A:
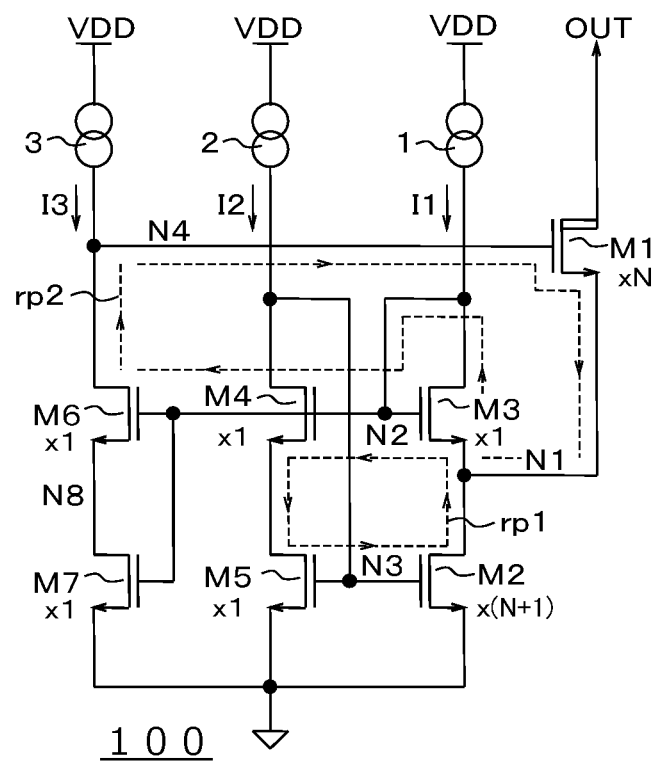
FIG. 2A is a circuit diagram according to a modification of the current drive circuit according to the first embodiment.
Figure 2B:
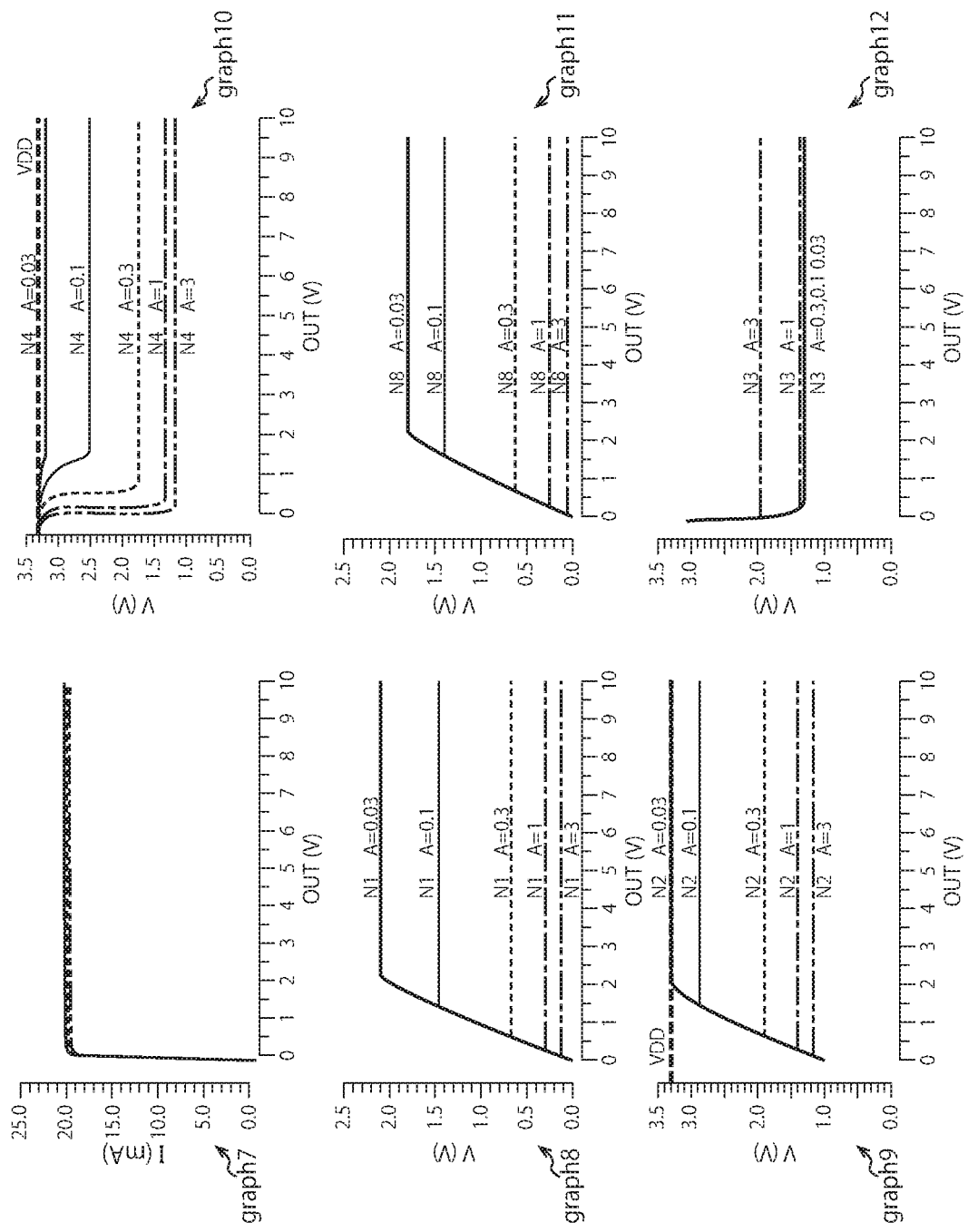
FIG. 2B is a graph showing electrical characteristics in the current drive circuit of FIG. 2A.

FIG. 2A is a circuit diagram according to a modification of the current drive circuit 100 of FIG. 1A. FIG. 2B is a graph (graph7 to graph12) showing electrical characteristics in the current drive circuit 100 of FIG. 2A. In graph7 to graph12, the output voltage (V) is taken along the abscissa. In graph7, the drain current of the first transistor M1 is taken along the ordinate. In graph8 to graph12, the voltage (V) at N1, N2, N4, N8, and N3 is taken along the ordinate, respectively. By changing the size of the seventh from ×1 to ×A, it is possible to change the voltages at N1, N2, N4, N8, and N3, but the current of the terminal OUT does not change so much even if the voltages at N1, N2, N4, N8, and N3 change.

The current drive circuit 100 of FIG. 2A includes a seventh transistor M7 in place of the resistor R1. The seventh transistor M7 shares the gate with the third transistor M3, the fourth transistor M4, and the sixth transistor M6. A drain of the seventh transistor M7 is connected to the source of the sixth transistor M6, and a source of the seventh transistor M7 is connected to the ground node. The seventh transistor M7 has the size comparable with the third to sixth transistors M3 to M6. As similar to the second to sixth transistors M2 to M6, the seventh transistor M7 has a low withstand voltage and is, for example, an NMOS transistor.

Like the resistor R1 of FIG. 1A, the seventh transistor M7 of FIG. 2A is provided to generate the gate voltage of the first transistor M1. As shown in FIG. 2B, the saturation potential at N1 can be set with an overdrive voltage of the seventh transistor M7, which gives N8 a saturation potential due to a drain current I3. Like in FIG. 1B, the saturation potentials at N1 and N8 become almost the same potential due to a feedback loop rp2. As a necessary condition therefor, N2 and N4 relating to N1 and N8 have to be set not to saturate in the vicinity of the power supply voltage VDD.

Figure 2C:
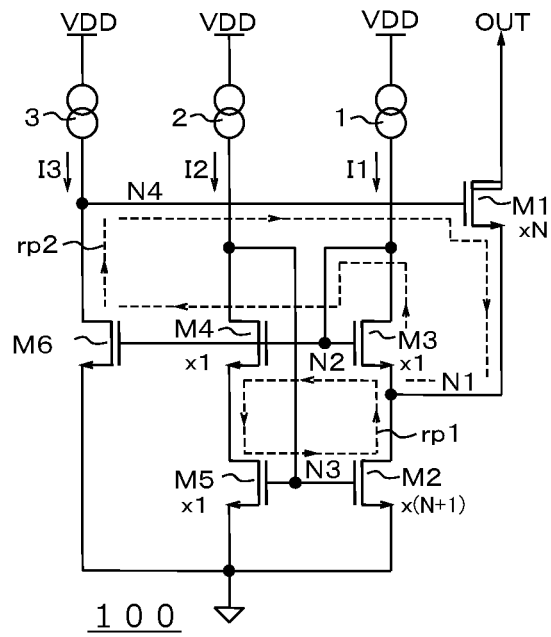
FIG. 2C is a circuit diagram showing a modification of the circuit of FIG. 2A.

FIG. 2C is a circuit diagram showing a modification of the circuit of FIG. 2A. FIG. 2C is a circuit diagram showing a circuit example in which the sixth transistor M6 and the seventh transistor M7 in FIG. 2A are combined into a single sixth transistor M6. The size (gate width W/gate length L) of the sixth transistor M6 is set so that the total of an over drive voltage and a threshold voltage of the sixth transistor M6 at a drain current I3 is equal to the total of an over drive voltage of the seventh transistor M7 at the drain current I3, and an over drive voltage and a threshold voltage of the sixth transistor M6 at the drain current I3, as shown in FIG. 2B.

Figure 2D:
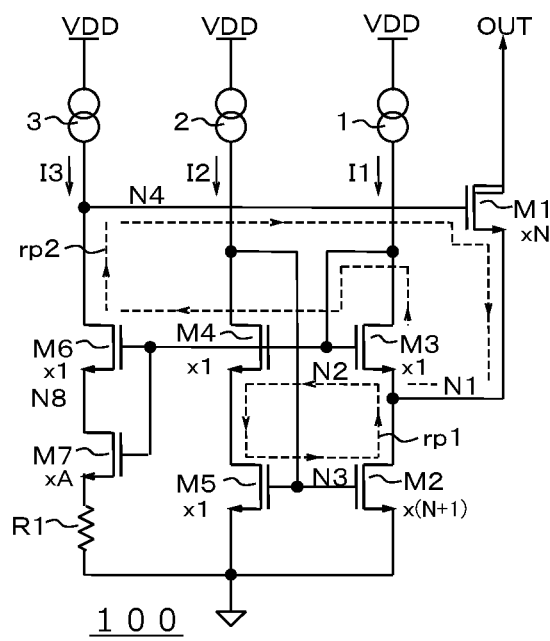
FIG. 2D is a circuit diagram showing another modification of the circuit of FIG. 2A.

FIG. 2D is a circuit diagram showing another modification of the circuit of FIG. 2A. FIG. 2D is a circuit diagram showing a circuit example in which N8 setting is made with both of size setting to the seventh transistor M7 and I3×R1.

Figure 2E:
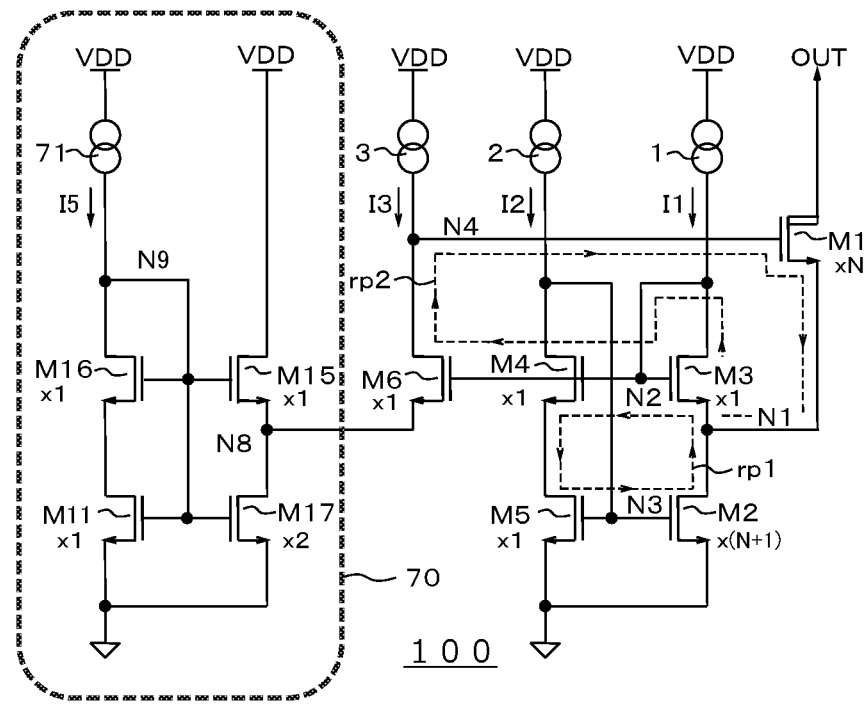
FIG. 2E is a circuit diagram showing still another modification of the circuit of FIG. 2A.

FIG. 2E is a circuit example which shortens the time until N4 becomes stable with the feedback of the roop rp2 by raising the potential at N8 by a source follower circuit 70 when the N4 potential is raised again or just after restarting the current supply. The source follower circuit 70 of FIG. 2E has the similar circuit configuration as the source follower circuit 70 of FIG. 1C. More specifically, the source follower circuit 70 of FIG. 2E have transistors M11 and M17, instead of the resistors R9 and R8 in the source follower circuit 70 of FIG. 1C.

Figure 2F:
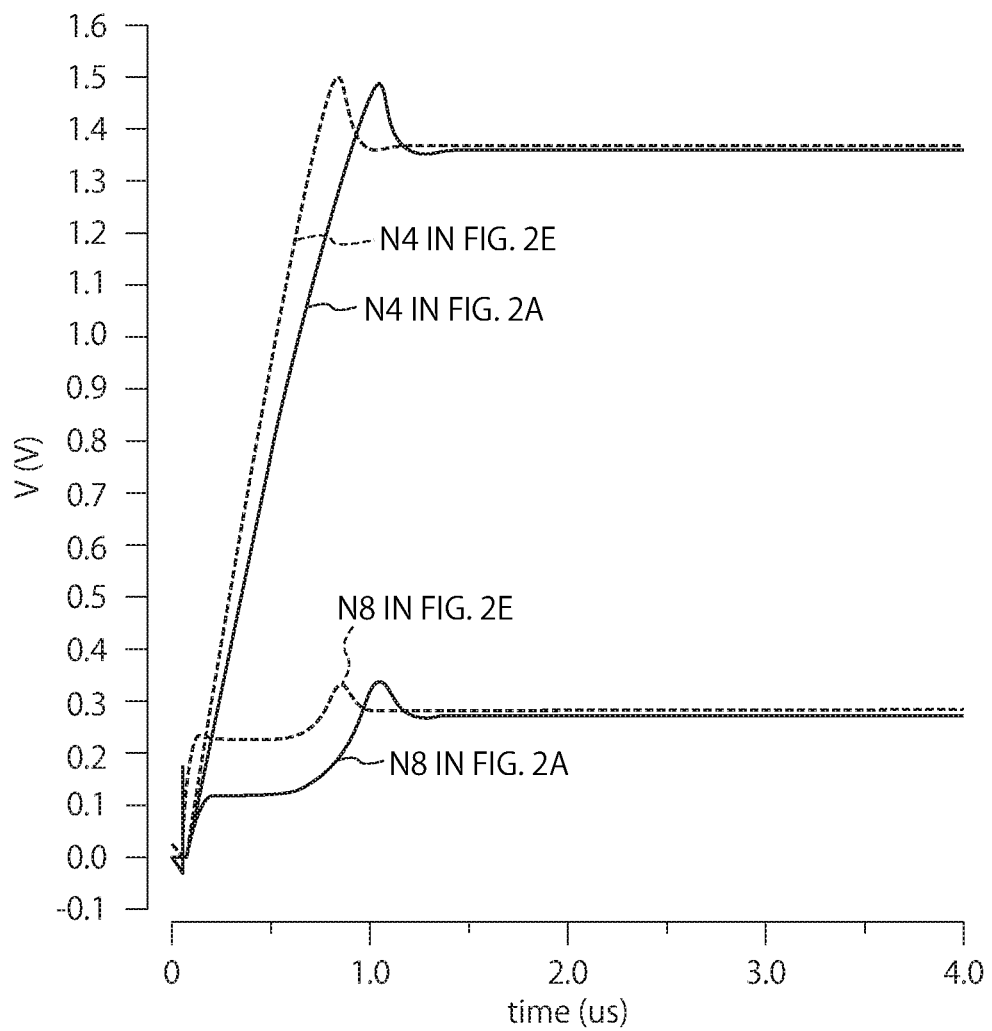
FIG. 2F is a graph illustrating waveforms at N4 and N8 in the circuits of FIGS. 2A and 2E.

FIG. 2F is a graph illustrating waveforms at N4 and N8 in the circuits of FIGS. 2A and 2E. As shown in FIG. 2F, when N4 is at zero volts in the initial state, in the circuit of FIG. 2A, the N8 potential remains in the vicinity of 0.1 volts until the N4 potential exceeds the threshold voltage, whereas, in the circuit of FIG. 2E, the setting time is shortened by about 20% because the N8 potential is raised quickly to 0.2 volts or higher by the source follower circuit 70.

Figure 2G:
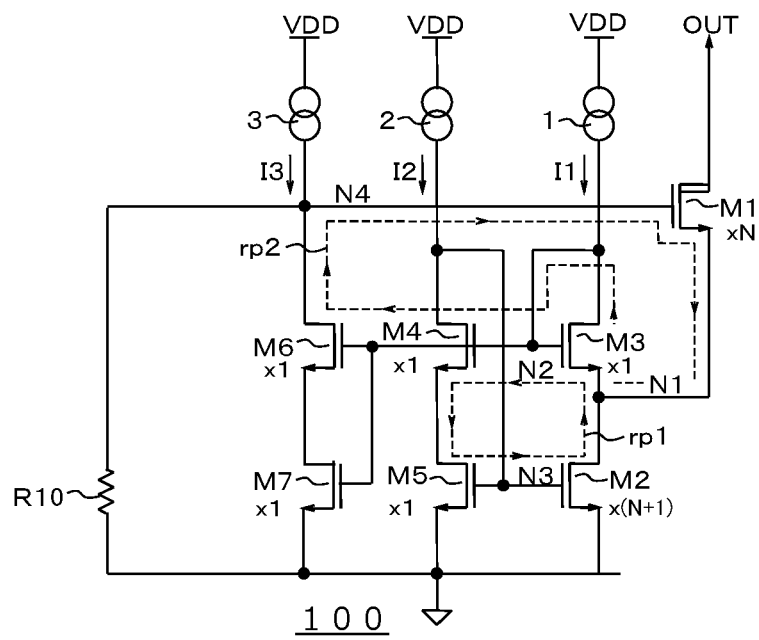
FIG. 2G is a circuit diagram showing a further modification of the circuit of FIG. 2A.

FIG. 2G is a circuit diagram showing a further modification of the circuit of FIG. 2A. FIG. 2G is a circuit diagram showing an example in which the N4 potential is pulled down with a resistor R10 so that an LED current is not generated when the power supply voltage VDD is insufficient. In the circuit of FIG. 2G, the drain current of the sixth transistor M6 is reduced from I3 to I3−N4 potential/R10.

Figure 2H:
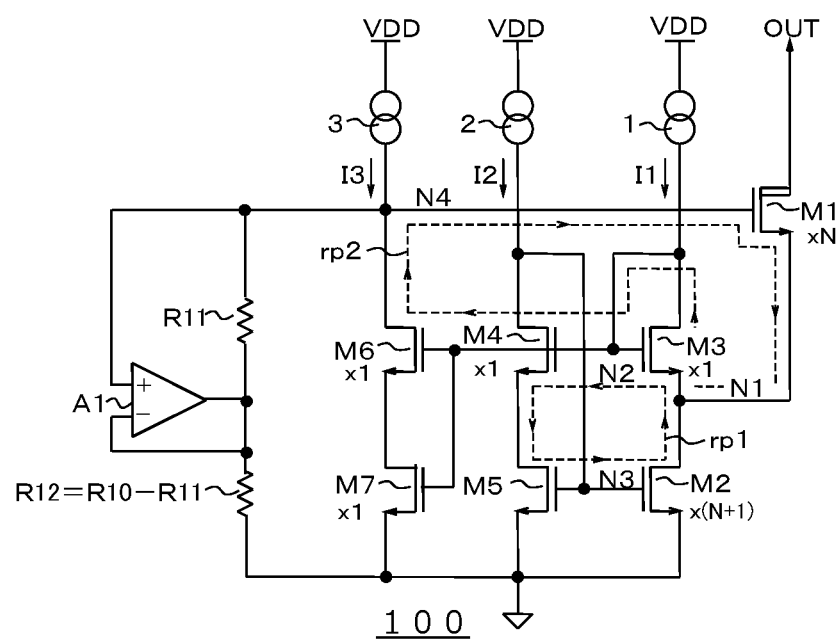
FIG. 2H is a circuit diagram showing a still further modification of the circuit of FIG. 2A.

FIG. 2H is a circuit diagram showing a still further modification of the circuit of FIG. 2A. FIG. 2H shows a circuit example that compensates for the decrease in the N4 potential due to the resistor R10 of FIG. 2G with a buffer amplifier A1. In FIG. 2H, the relation between the buffer amplifier A1 and the resistors R11 and R12 connected to the buffer amplifier A1 is similar to that of FIG. 1F.

Figure 3:
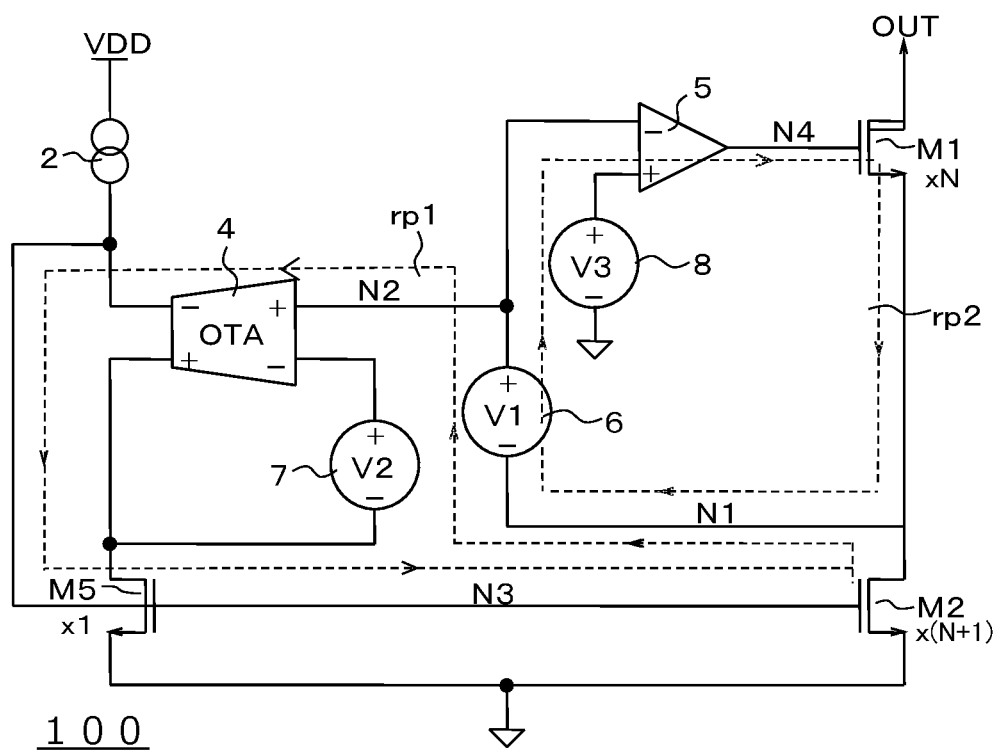
FIG. 3 is an equivalent circuit diagram of a main part of the current drive circuit according to the first embodiment.

FIG. 3 is an equivalent circuit diagram of a main part of the current drive circuit 100 of FIGS. 1A and 2A. The equivalent circuit of FIG. 3 includes the first transistor M1, the second transistor M2, the fifth transistor M5, the second current source 2, an operational trans-conductance amplifier (OTA) 4, a differential amplifier 5, and first to third voltage sources 6 to 8.

The OTA 4 outputs a current proportional to a difference between two input voltages. A non-inverting input terminal of the OTA 4 is connected to inverting input terminals of the first voltage source 6 and the differential amplifier 5, and the non-inverting input terminal corresponds to the node N2. An inverting input terminal of the OTA 4 is connected to the second voltage source 7 that outputs a voltage V2. Two current output terminals of the OTA 4 are inserted in a current path from the second current source 2. To this current path, the second current source 2 and the fifth transistor M5 are connected. The third voltage source 8 that outputs a voltage V3 is connected to a non-inverting input terminal of the differential amplifier 5. The first voltage source 6 that outputs a voltage V1 is connected to an inverting input terminal of the differential amplifier 5. An output terminal of the differential amplifier 5 is connected to the gate of the first transistor M1 through the node N4.

The equivalent circuit of FIG. 3 includes a first control loop rp1 that passes through the second transistor M2, the OTA 4, and the fifth transistor M5 and includes a second control loop rp2 that passes through the differential amplifier 5, the first transistor M1, and the first voltage source 6.

In the first control loop rp1, a potential of the node N3 is determined according to a potential of the node N1. Furthermore, the first control loop rp1 controls a drain current of the second transistor M2 to be I2×(1+N)≈I2×N. The second control loop rp2 controls a potential of the node N4 so that the node N1 has a potential equivalent to that of the node N8 illustrated in FIGS. 1A and 2A. With an output voltage VOUT being higher than a target voltage of the node N1 (potential of the node N8=V3−V1), the second control loop rp2 maintains the node N1 at the target voltage, which reduces potential fluctuations of the node N4. With an output voltage VOUT being lower than the target voltage, the second control loop rp2 raises the potential of the node N4 and feeds back so as to prevent a decrease in potential of the node N1. Even with such feedback control, when the potential of the node N1 decreases, the first control loop rp1 raises the potential of the node N3 and performs feedback control to maintain the drain currents of the first transistor M1 and the second transistor M2.

In the circuit illustrated in FIGS. 1A and 2A, the first control loop rp1 serves as a path passing through the fourth transistor M4, the fifth transistor M5, the second transistor M2, and the third transistor M3. In addition, the second control loop rp2 serves as a path passing through the first transistor M1, the third transistor M3, and the sixth transistor M6.

In the circuit illustrated in FIGS. 1A and 2A, since the first transistor M1 and the second transistor M2 are much larger in size than the third to seventh transistors M3 to M7, it takes time from input of a startup signal in the power-on state to the time when the first transistor M1 starts outputting a current. Many different configurations are employable as a configuration of a startup assist circuit for shortening the time described above. Hereinafter, first to fifth specific examples that typify the startup assist circuit will be described.

(First Specific Example of Startup Assist Circuit)

A first specific example of the startup assist circuit is configured to temporarily increase a charging current of the node N3 which is linked to the gate of the second transistor M2. The term "temporarily" indicates, for example, a predetermined time from the input of the startup signal.

Figure 4B:
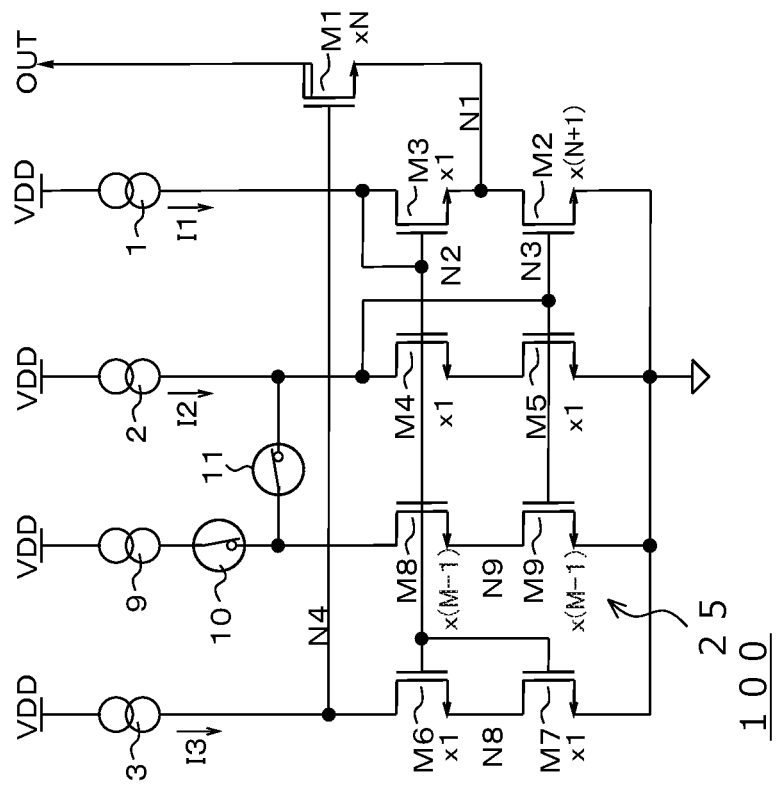
FIGS. 4A and 4B are circuit diagrams of the current drive circuit according to the first embodiment including a startup assist circuit of a first specific example.
Figure 4A:
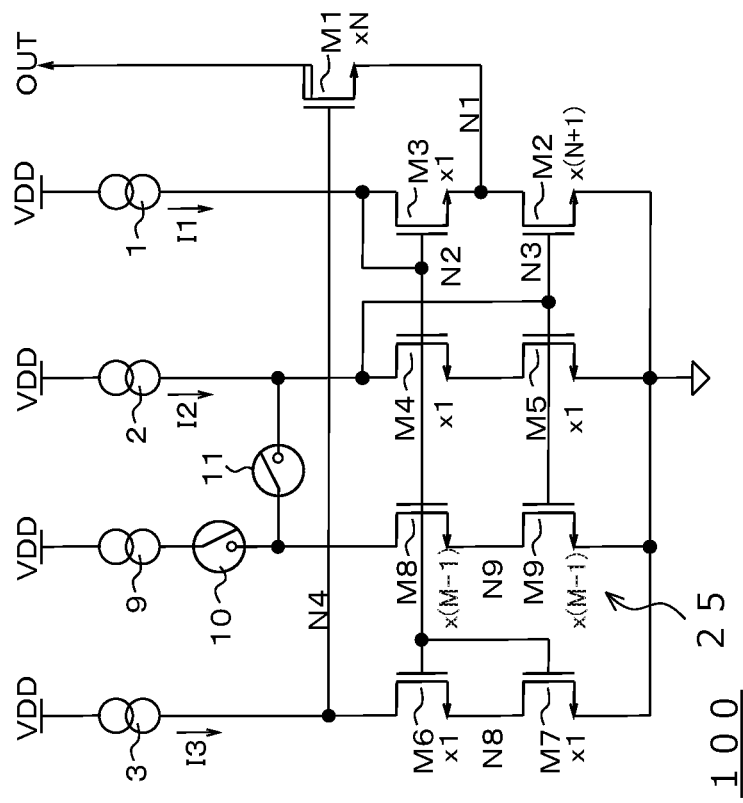

FIGS. 4A and 4B are circuit diagrams of the current drive circuit 100 including a startup assist circuit 25 according to the first specific example. In addition to the configuration of the current drive circuit 100 in FIG. 2A, for example, the startup assist circuit 25 in FIGS. 4A and 4B includes an eighth transistor M8, a ninth transistor M9, a fourth current source 9, a first startup changeover switch 10, and a second startup changeover switch 11.

The eighth transistor M8 shares the gate with the third transistor M3, the fourth transistor M4, and the sixth transistor M6. The ninth transistor M9 shares the gate with the second transistor M2 and the fifth transistor M5. A source of the eighth transistor M8 is connected to a drain of the ninth transistor M9, and a source of the ninth transistor M9 is connected to the ground node. The first startup changeover switch 10 is interposed between the fourth current source 9 and a drain of the eighth transistor M8. The second startup changeover switch 11 is interposed between the drain of the eighth transistor M8 and the drain of the fourth transistor M4.

The eighth transistor M8 and the ninth transistor M9 is (M−1) times the size of the fourth transistor M4 and the fifth transistor M5 so that the fourth current source 9 supplies (M−1) times as many currents as the current flown from the second current source 2.

FIG. 4A illustrates a state before the startup assist circuit 25 assists startup. In FIG. 4A, the first startup changeover switch 10 and the second startup changeover switch 11 both block connection paths. Accordingly, the eighth transistor M8 and the ninth transistor M9 are in the off state.

FIG. 4B illustrates a state in which the startup assist circuit 25 assists startup within a predetermined period from the input of the startup signal. In FIG. 4B, the first startup changeover switch 10 and the second startup changeover switch 11 both carry currents through the connection paths. Accordingly, compared with a case where the eighth and ninth transistors M8 and M9 and the second current source 2 are not provided, M times as many currents flow through the node N3, which leads to reduction in startup time to 1/M. After the predetermined period, as illustrated in FIG. 4A, the first startup changeover switch 10 and the second startup changeover switch 11 block the connection paths, causing the eighth and ninth transistors M8 and M9 and the second current source 2 to stop operation.

(Second Specific Example of Startup Assist Circuit 25)

A second specific example of the startup assist circuit 25 is configured to raise the potential of the node N3 for the predetermined period from the input of the startup signal.

Figure 5:
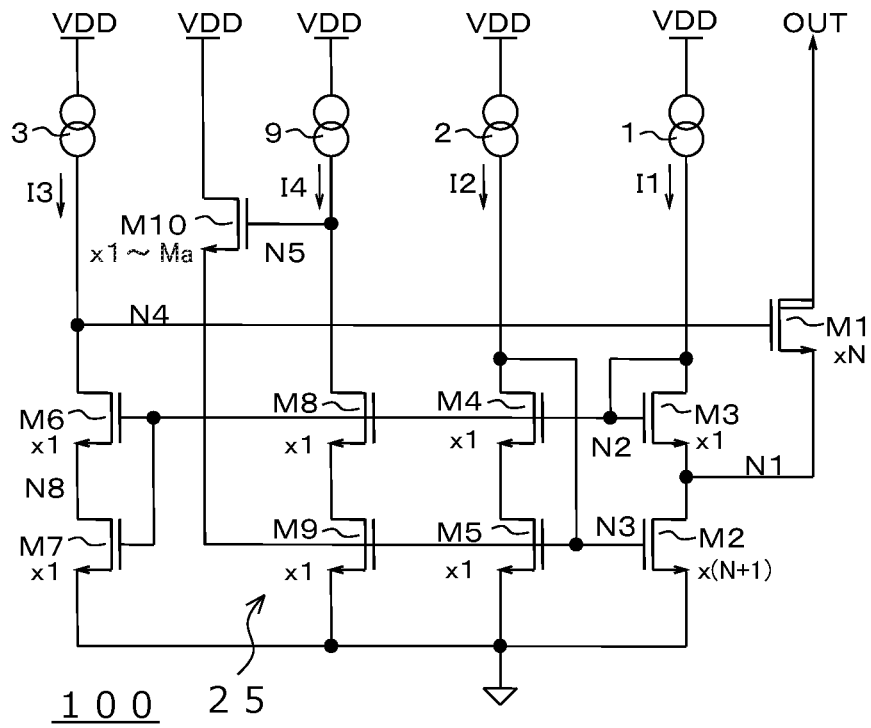
FIG. 5 is a circuit diagram of the current drive circuit according to the first embodiment including a startup assist circuit of a second specific example.

FIG. 5 is a circuit diagram of the current drive circuit 100 including the startup assist circuit 25 according to the second specific example. The startup assist circuit 25 of FIG. 5 includes, for example, eighth to tenth transistors M8 to M10 and the fourth current source 9. The eighth transistor M8, the ninth transistor M9, and the fourth current source 9 are connected in a manner similar to the case in FIGS. 4A and 4B. A gate of the tenth transistor M10 is connected to the drain of the eighth transistor M8, a drain of the tenth transistor M10 is connected to the power supply voltage node VDD, a source of the tenth transistor M10 is connected to the gate shared by the second transistor M2, the fifth transistor M5, and the ninth transistor M9. In the startup assist circuit 25, the eighth transistor M8 is set to have larger (gate width W/gate length L) per current I4 than (gate width W/gate length L) per current I2 of the fourth transistor M4 so that the N5 potential is certainly lowered below (N3 potential)+(M10 threshold voltage) when N3 is at a predetermined voltage. The tenth transistor M10 has the same size as the third to ninth transistors M3 to M9 or is Ma or less times (Ma>1) the size of the third to ninth transistors M3 to M9.

For the predetermined period from the input of the startup signal, a gate potential of the tenth transistor M10 reaches a high level, which increases the potential of the node N3 linked to the gate of the second, fifth, and ninth transistors M2, M5, and M9. When the drain current of the second transistor M2 becomes a-times (a<1, for example a=0.5) as many currents as the drain current of the second transistor M2 in a steady state, a potential of the node N5 linked to the gate of the tenth transistor M10 falls to a low level, and the tenth transistor M10 is in the off state, which ends the startup assisting operation.

Hereinafter, the expressions "the predetermined period from the input of the startup signal" and "a-times as many currents as (the drain current)" will be supplemented. First, "the predetermined period from the input of the startup signal" indicates "a period (predetermined period), in the initial state where the potentials of the nodes N2 and N3 are in the initial state and the eighth transistor M8 and the ninth transistor M9 connected in series are not energized, which is from the start of current supply to the nodes N2 to N5 of the first to fourth current sources 1 to 3 and 9 (at the time of input of the startup signal) to the time when the nodes N2 to N5 approach the steady state due to the current supply and when the drain currents of the eighth transistor M8 and the ninth transistor M9 reach a×(gate width W/gate length L of M8)/(gate width W/gate length L of M4) times the current from the second current source 2". It should be noted that the startup signal may be input by an on-signal of the current source.

Next, the expression "a-times as many currents as (the drain current)" will be described. The fourth current source 9 is set to output a×(gate width W/gate length L of M8)/(gate width W/gate length L of M4) times the current from the second current source 2 (provided that a<1, for example, a=0.5). In the predetermined period, the current suppliability of the fourth current source 9 surpasses the drain currents of the eighth transistor M8 and the ninth transistor M9 connected in series. Therefore, the gate potential of the tenth transistor M10 reaches a high level, and the fourth current source 9 supplies a current so that the potential of the node N3 linked to the gates of the second, fifth, and ninth transistors M2, M5, M9 approaches the steady state. After the predetermined period, in the saturation region, the drain currents of the eighth transistor M8 and the ninth transistor M9 connected in series surpasses the current suppliability of the fourth current source 9. Therefore, the potential of the node N5 linked to the gate of the tenth transistor M10 falls to a low level, and the tenth transistor M10 is in the off state, which ends the startup assisting operation. The timing is when the drain current of the second transistor M2 exceeds a-times as many currents as the drain current of the second transistor M2 in the steady state.

(Third Specific Example of Startup Assist Circuit 25)

A third specific example of the startup assist circuit 25 is configured to raise the potential of the node N4 linked to the gate of the first transistor M1 for the predetermined period from the input of the startup signal.

Figure 6:
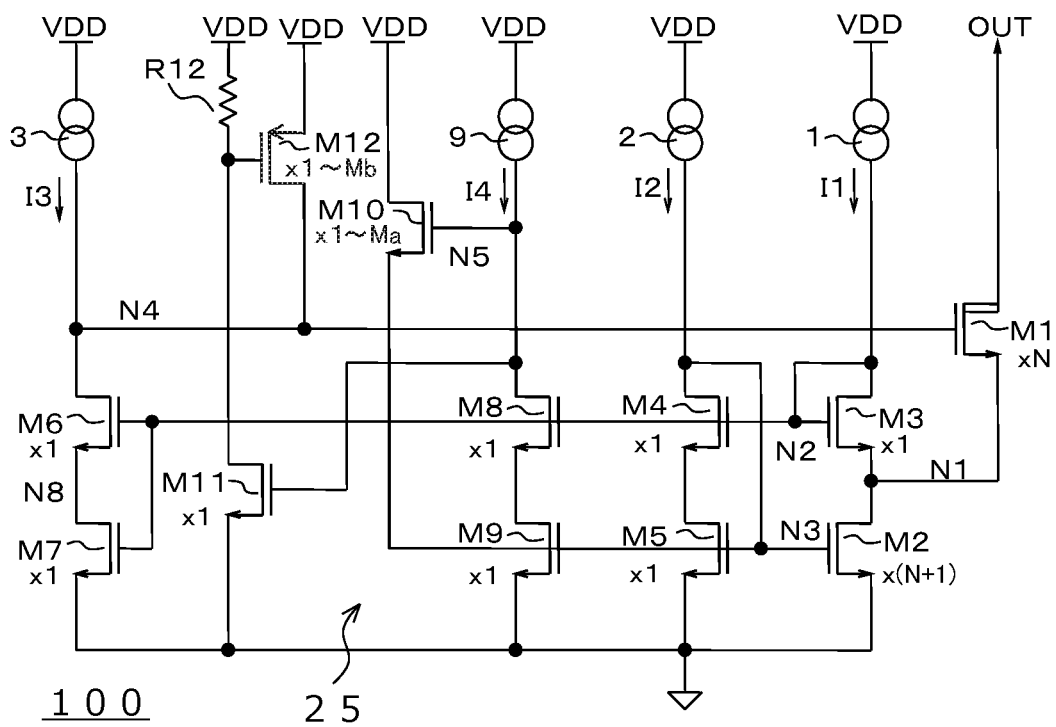
FIG. 6 is a circuit diagram of the current drive circuit according to the first embodiment including a startup assist circuit of a third specific example.

FIG. 6 is a circuit diagram of the current drive circuit 100 including the startup assist circuit 25 according to the third specific example. The startup assist circuit 25 in FIG. 6 includes, for example, eighth to twelfth transistors M8 to M12, and the fourth current source 9. The eighth to tenth transistors M8 to M10 and the fourth current source 9 are connected in a manner similar to the case in FIG. 5.

The twelfth transistor M12 is different in conductivity type from the first to tenth transistors M1 to M10. The twelfth transistor M12 controls the gate voltage of the first transistor M1. The eleventh transistor M11 shares the gate with the tenth transistor M10. A gate of the twelfth transistor M12 is connected to a drain of the eleventh transistor M11. A source of the eleventh transistor M11 is connected to the ground node. A resistor R12 is connected between the gate of the twelfth transistor M12 and the power supply voltage node VDD. The twelfth transistor M12 has the same size as the third to ninth transistors M3 to M9 or is Mb or less times (Mb>1) the size of the third to ninth transistors M3 to M9.

For the predetermined period from the input of the startup signal, the gate potential of the tenth transistor M10 reaches a high level, which increases the potential of the node N3 linked to the gate of the second, fifth, and ninth transistors M2, M5, and M9. Since a gate potential of the eleventh transistor M11 also increases, a gate potential of the twelfth transistor M12 decreases, and the potential of the node N4 linked to the gate of the first transistor M1 increases. When the predetermined period ends, and the potential of the node N3 linked to the gate of the second transistor M2 further approaches the steady state, and the drain current of the second transistor M2 becomes a-times (a<1, a=0.5, for example) as many currents as the current in the steady state, the potential of the node N5 linked to the gate of the tenth transistor M10 falls to a level, and the tenth transistor M10 and the eleventh transistor M11 are in the off state. Accordingly, the twelfth transistor M12 is also in the off state.

Figure 7:
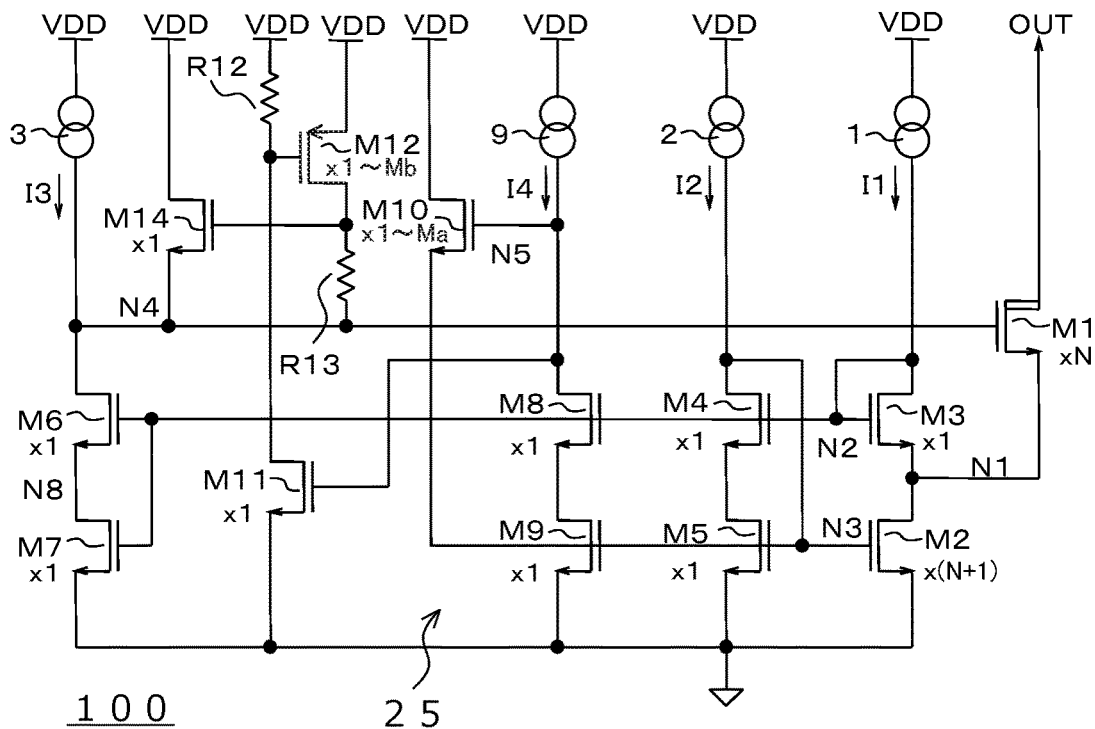
FIG. 7 is a circuit diagram of the current drive circuit according to the first embodiment including a startup assist circuit of a modification of the third specific example.

As a modification of the case illustrated in FIG. 6, the current drive circuit 100 may be provided with a fourteenth transistor M14 and a resistor R13 connected to the twelfth transistor M12 by Darlington connection, as illustrated in FIG. 7.

In the first and second specific examples of the startup assist circuit, during the predetermined period from the input of the startup signal, currents as many as a×I2 (a<1) are applied to the eighth transistor M8 and the ninth transistor M9 so as to accelerate the rise of the drain current of the second transistor M2. However, the potential of the node N5 linked to the drain of the eighth transistor M8 reaches at a high level immediately after the input of the startup signal, and then, precipitously drops. Monitoring the potential of the node N5 makes it possible to determine whether to end the startup assisting operation of the second transistor M2, that is, the end timing of the predetermined period.

Figure 8:
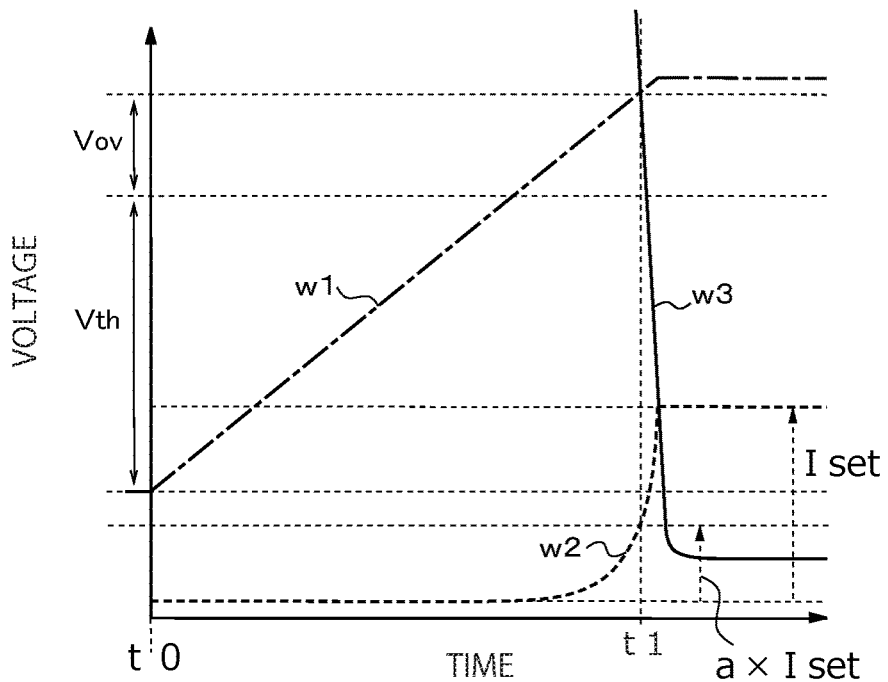
FIG. 8 is a graph of operating waveform of each unit inside the current drive circuit illustrated in FIG. 5 or FIG. 6.

FIG. 8 illustrates an operating waveform of each unit inside the current drive circuit 100 of FIG. 5 or FIG. 6. When the startup signal is input at time t0, currents as many as a×I2 flow through the eighth and ninth transistors M8 and M9 to assist startup, which leads to a linear increase of the potential (waveform w1) of the node N3 linked to the gate of the second transistor M2. After the time (time t1) when the node N3 exceeds a threshold voltage, the drain current (waveform w2) of the second transistor M2 precipitously increases. Furthermore, the potential (waveform w3) of the node N5 linked to the drain of the eighth transistor M8 precipitously drops, but the time when the potential of the node N5 reaches a predetermined potential may be set as the end timing of the startup assist operation.

(Fourth Specific Example of Startup Assist Circuit 25)

In a fourth specific example of the startup assist circuit 25, a buffer is inserted in at least one of the node N4 linked to the gate of the first transistor M1 and the node N3 linked to the gate of the second transistor M2.

Figure 9A:
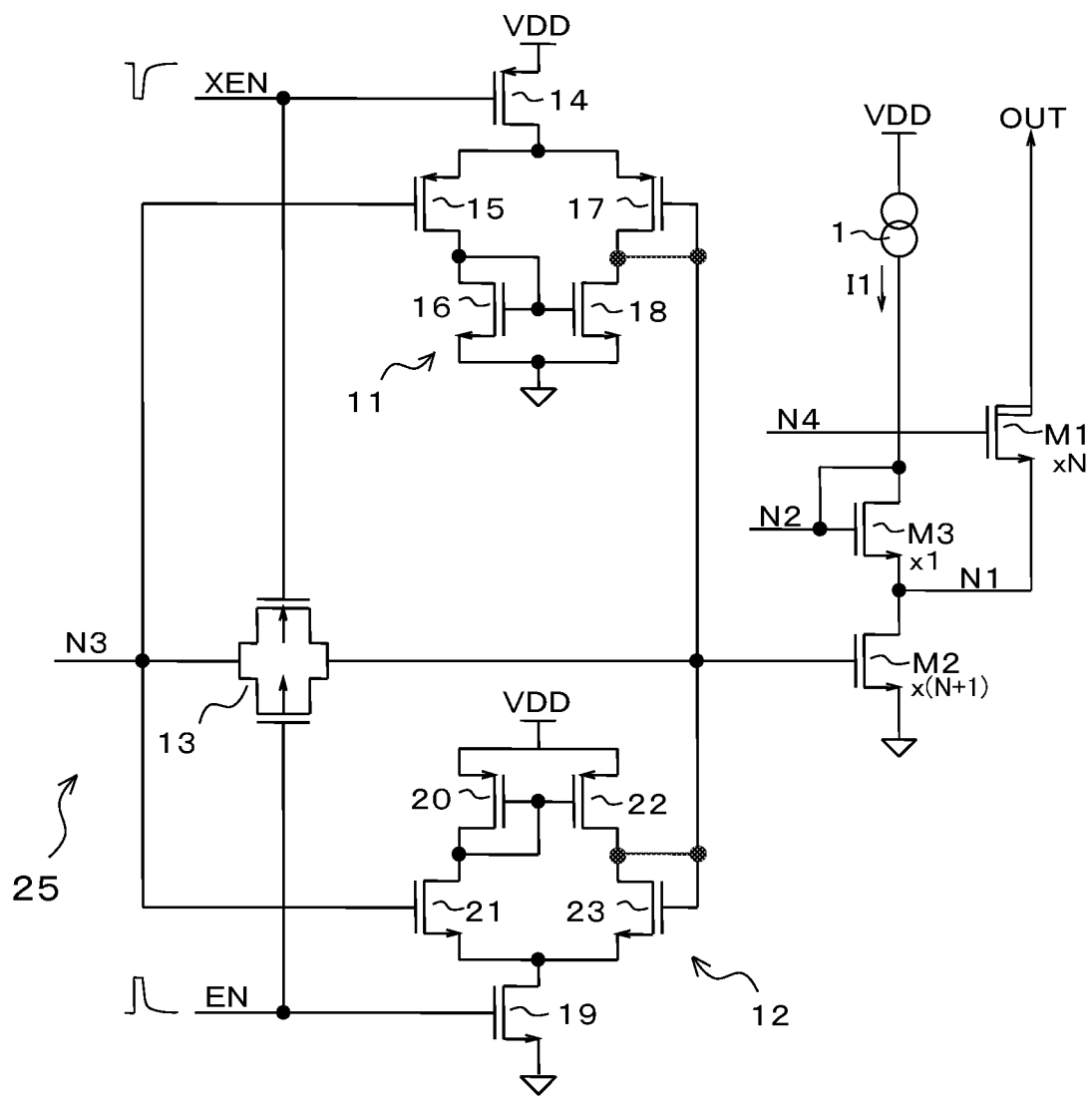
FIG. 9A is a circuit diagram illustrating an example in which a buffer is inserted in the startup assist circuit.
Figure 9B:
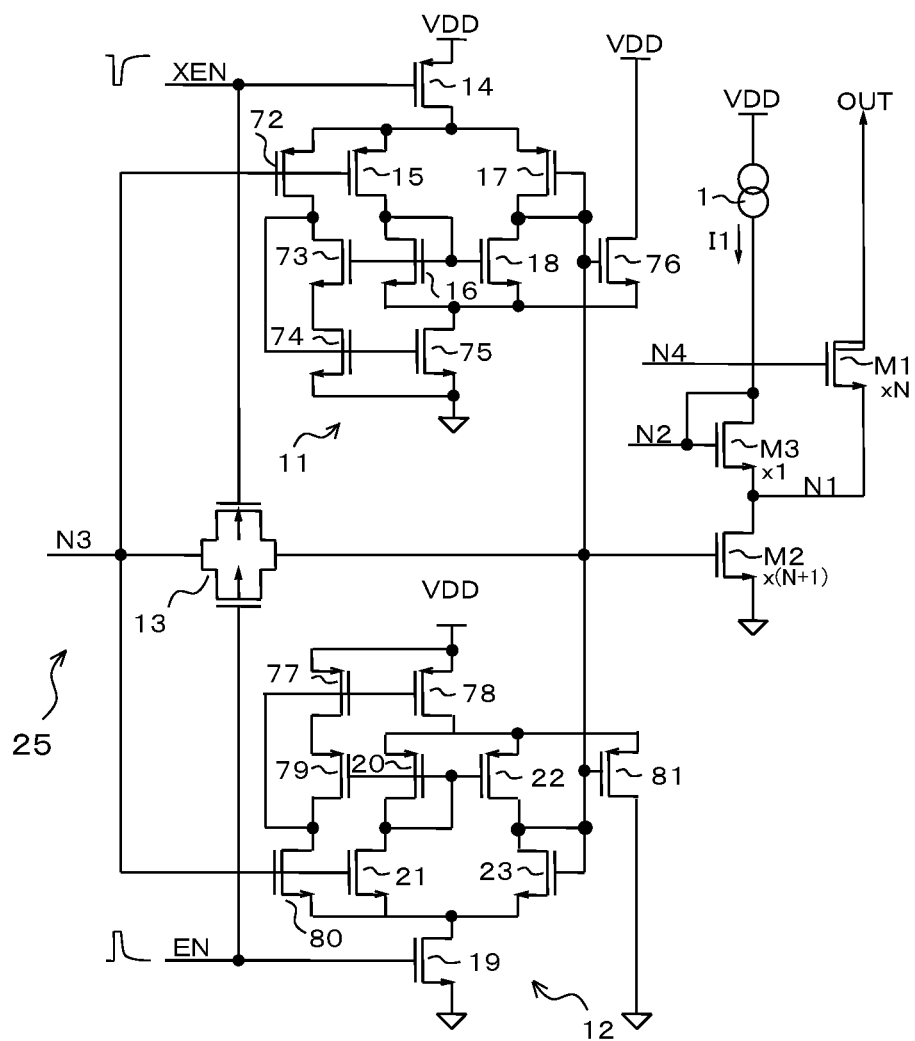
FIG. 9B is a circuit diagram showing a modification of FIG. 9A.

FIGS. 9A and 9B are circuit diagrams of the startup assist circuit 25 illustrating examples in which the buffer is inserted in the node N3 linked to the node of the second transistor M2. The startup assist circuit 25 in FIGS. 9A and 9B includes a first buffer 11, a second buffer 12, and an analog switch 13. Pulse signals XEN and EN are input to the first buffer 11 and the second buffer 12 in synchronization with the input of the startup signal. The pulse signals XEN and EN have a steep rising (falling) edge at the time of input and a gradually changing falling (rising) edge at the end of the input. The reason for gradually changing the falling (rising) edge at the end of the input is to prevent overshoot and undershoot and to gently end the startup assisting operation.

The first buffer 11 shown in FIG. 9A includes a PMOS transistor 14 connected to the power supply voltage node VDD and functioning as a current source; a PMOS transistor 15 and an NMOS transistor 16 connected between a drain of the PMOS transistor 14 and the ground node by cascode connection; and a PMOS transistor 17 and an NMOS transistor 18 connected between the drain of the PMOS transistor 14 and the ground node by cascode connection.

The first buffer 11 shown in FIG. 9B has additional transistors 72 to 76 in order to conform with the drain voltages of the transistors 16 and 18 in FIG. 9A, thereby reducing the input and output offset of the first buffer 11.

The second buffer 12 shown in FIG. 9A includes an NMOS transistor 19 connected to the ground node and functioning as a current source; a PMOS transistor 20 and an NMOS transistor 21 connected between the power supply voltage node VDD and a drain of the NMOS transistor 19 by cascode connection; and a PMOS transistor 22 and an NMOS transistor 23 connected between the power supply voltage node VDD and the drain of the NMOS transistor 19 by cascode connection.

The second buffer 11 shown in FIG. 9B has additional transistors 77 to 81 in order to conform with the drain voltages of the transistors 20 and 22 in FIG. 9A, thereby reducing the input and output offset of the second buffer 12.

A gate of the PMOS transistor 15 and a gate of the NMOS transistor 21 are connected to an input terminal of the startup assist circuit 25 together with an input node of the analog switch 13. A gate of the PMOS transistor 17 and a gate of the NMOS transistor 23 are connected to the gate of the second transistor M2.

With input of the pulse signals XEN and EN, the analog switch 13 blocks the connection path between the node N3 and the gate of the second transistor M2. When the pulse signals XEN and EN are no longer input, the analog switch 13 electrically connects the node N3 and the gate of the second transistor M2.

During a period of inputting the pulse signals XEN and EN, a signal on the node N3 is buffered by the first buffer 11 and the second buffer 12 and then input to the gate of the second transistor M2. Buffering the first buffer 11 and the second buffer 12 brings about a steep rising edge of the gate voltage of the second transistor M2, leading to reduction in startup time of the second transistor M2. When the pulse signals XEN and EN are no longer input, the first buffer 11 and the second buffer 12 stop the buffering operation, the node N3 and the gate of the second transistor M2 are electrically connected through the analog switch 13, and a normal operation is performed.

Figure 10A:
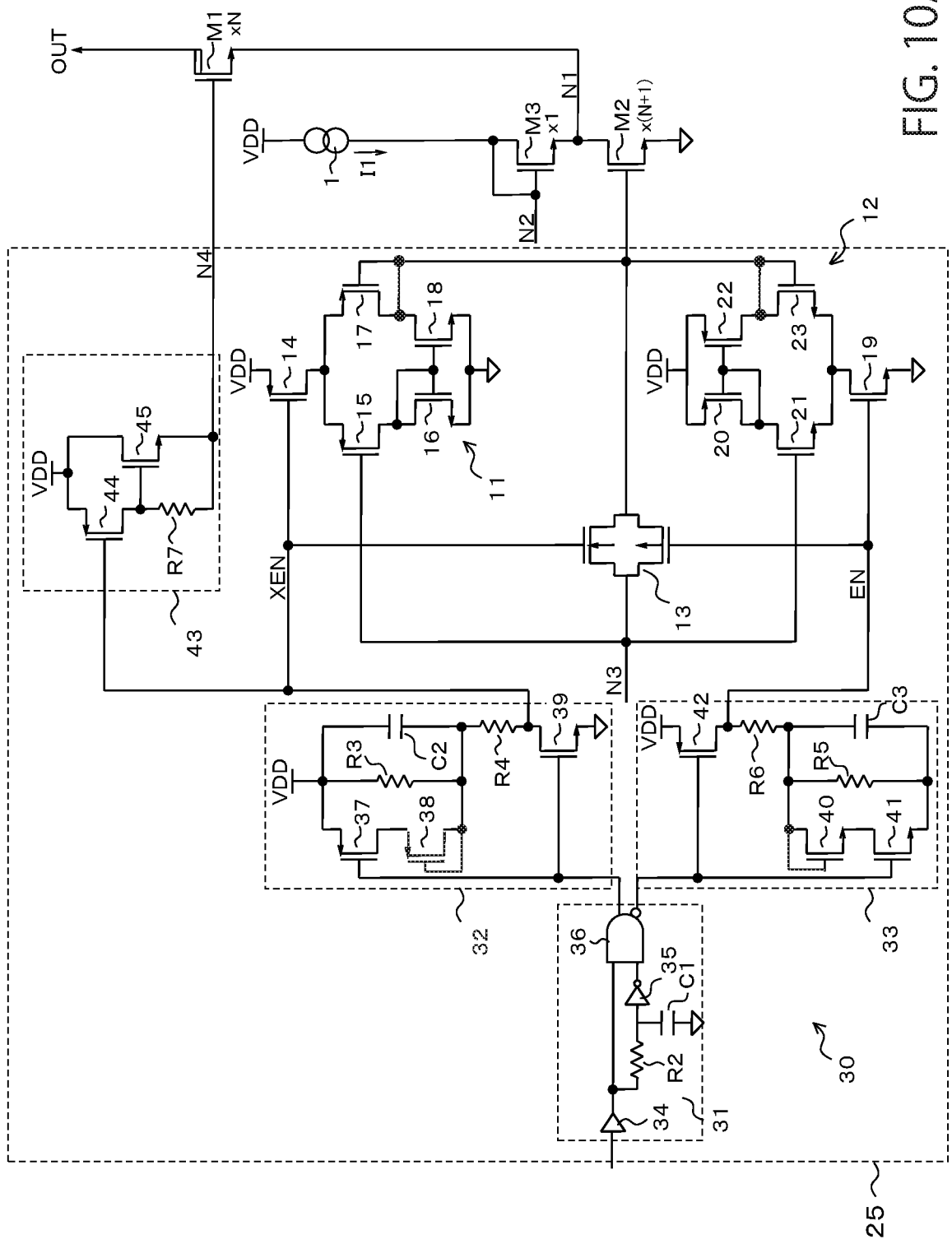
FIG. 10A is a circuit diagram in which a pulse generating circuit is added to the startup assist circuit of FIG. 9.
Figure 10B:
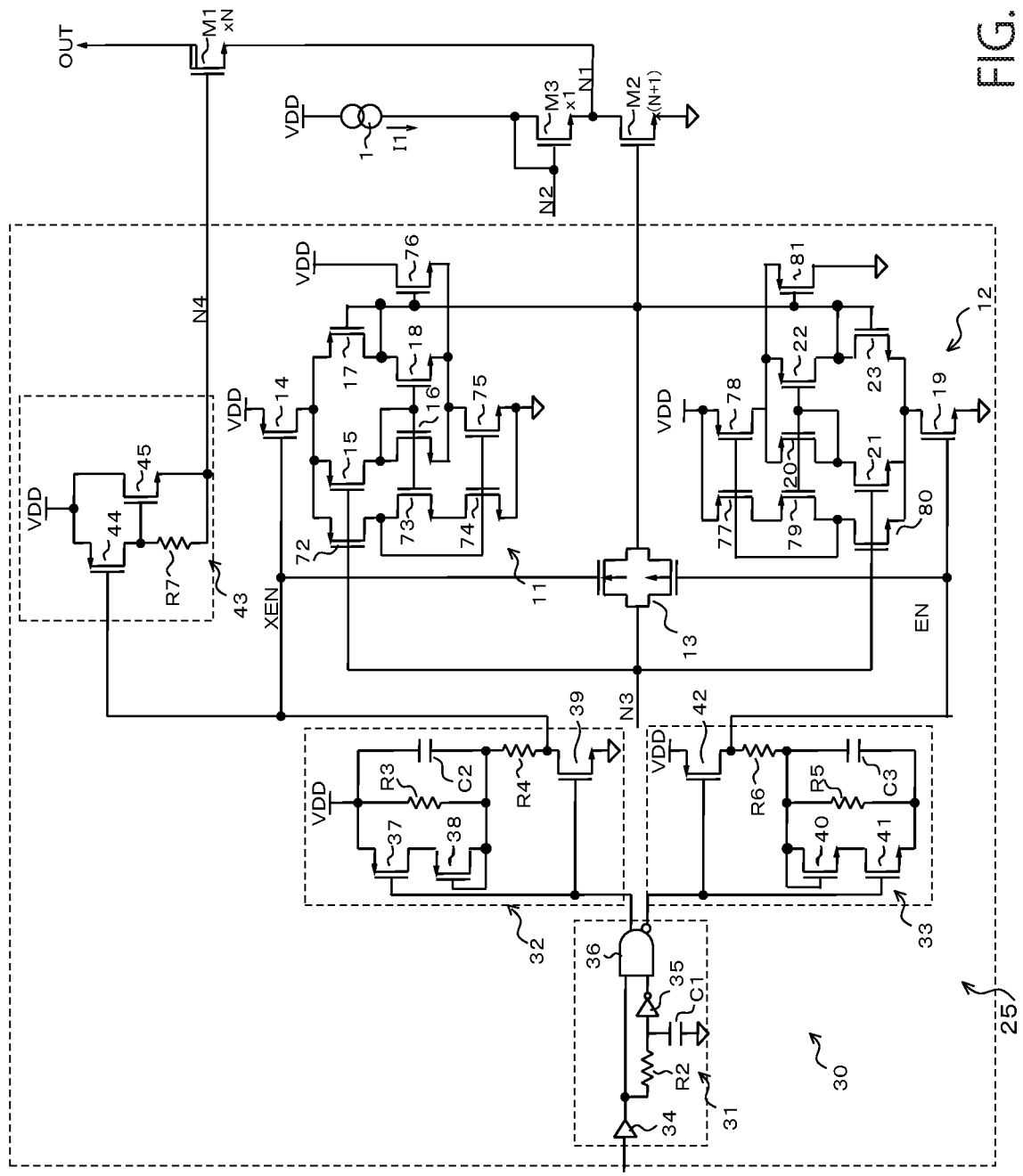
FIG. 10B is a circuit diagram showing a modification of FIG. 10A.

The pulse signals XEN and EN are generated, for example, in synchronization with the rising edge of the startup signal. FIG. 10A is a circuit diagram in which a pulse generating circuit 30 is added to the startup assist circuit 25 of FIG. 9A. FIG. 10B is a circuit diagram in which a pulse generating circuit 30 is added to the startup assist circuit 25 of FIG. 9B. The pulse generating circuit 30 in FIGS. 10A and 10B includes a one-shot pulse generator 31, a first waveform adjusting circuit 32, and a second waveform adjusting circuit 33.

The one-shot pulse generator 31 includes a buffer 34, a resistor R2, a capacitor C1, an inverter 35, and a logic gate 36. The startup signal is input to the buffer 34. When raising the startup signal, the resistor R2 and the capacitor C1 blunt a rising waveform of the start signal. The startup signal and a signal obtained by blunting the startup signal are input to the logic gate 36, and a one-shot pulse signal is generated. This one-shot pulse signal has a slightly gentle rising edge and a trailing falling edge.

The first waveform adjusting circuit 32 includes a circuit in which two PMOS transistors 37 and 38 connected by cascode connection, a resistor R3, and a capacitor C2 are connected in parallel; and a resistor R4 and an NMOS transistor 39 which are connected to this circuit in series.

The second waveform adjusting circuit 33 includes a circuit in which two connected NMOS transistors 40 and 41 connected by cascode connection, a resistor R5, and a capacitor C3 are connected in parallel; and a resistor R6 and a PMOS transistor 42 which are connected to this circuit in series.

A pulse signal XEN similar to that of FIG. 9A is output from a drain of the NMOS transistor 39. A pulse signal EN similar to that of FIG. 9A is output from a drain of the PMOS transistor 42.

Furthermore, the startup assist circuit 25 of FIG. 10A includes a high-speed startup circuit 43 that speedily starts up the gate of the first transistor M1. The high-speed startup circuit 43 includes a PMOS transistor 44, an NMOS transistor 45, and a resistor R7. A source of the PMOS transistor 44 is connected to the power supply voltage node VDD, and a drain of the PMOS transistor 44 is connected to a gate of the NMOS transistor 45 and one end of the resistor R7. A drain of the NMOS transistor 45 is connected to the power supply voltage node VDD, and a source of the NMOS transistor 45 is connected to the node N4 linked to the gate of the first transistor M1.

The current drive circuit 100 according to the first embodiment illustrated in FIG. 1A has been described so far, referring to modifications and specific examples. It should be noted that the current drive circuit 100 includes at least the third to sixth transistors M3 to M6 in order to drive the large-sized second transistor M2 having a low withstand voltage which is connected by cascode connection to the large-sized first transistor M1 having a high withstand voltage. The second to fifth transistors M2 to M5 are included in the first control loop rp1 that determines the potential of the node N3 according to the potential of the node N1 and controls the drain current of the second transistor M2 to be approximately I2×N. The third transistor M3 and the sixth transistor M6 are included in the second control loop rp2 that controls the potential of the node N1 linked with the source of the first transistor M1 and the drain of the second transistor M2 to be equivalent to the potential of the node N8 linked with the source of the sixth transistor M6. With such a configuration including the first control loop rp1 and the second control loop rp2, a constant current is output from the output terminal OUT even when the output voltage VOUT largely fluctuates.

As described with reference to FIGS. 9A and 10A, the current drive circuit 100 according to the first embodiment may be additionally provided with the startup assist circuit 25 inside the circuit. The startup assist circuit 25 makes it possible to shorten the time until the first transistor M1 starts outputting a current. The startup assist circuit 25 operates for the predetermined period from the input of the startup signal and stops operation after the predetermined period, which causes no possible increase of power consumption.

Second Embodiment

In a second embodiment, a circuit for high-speed operation is added to the current drive circuit 100 of FIG. 1A.

Figure 11:
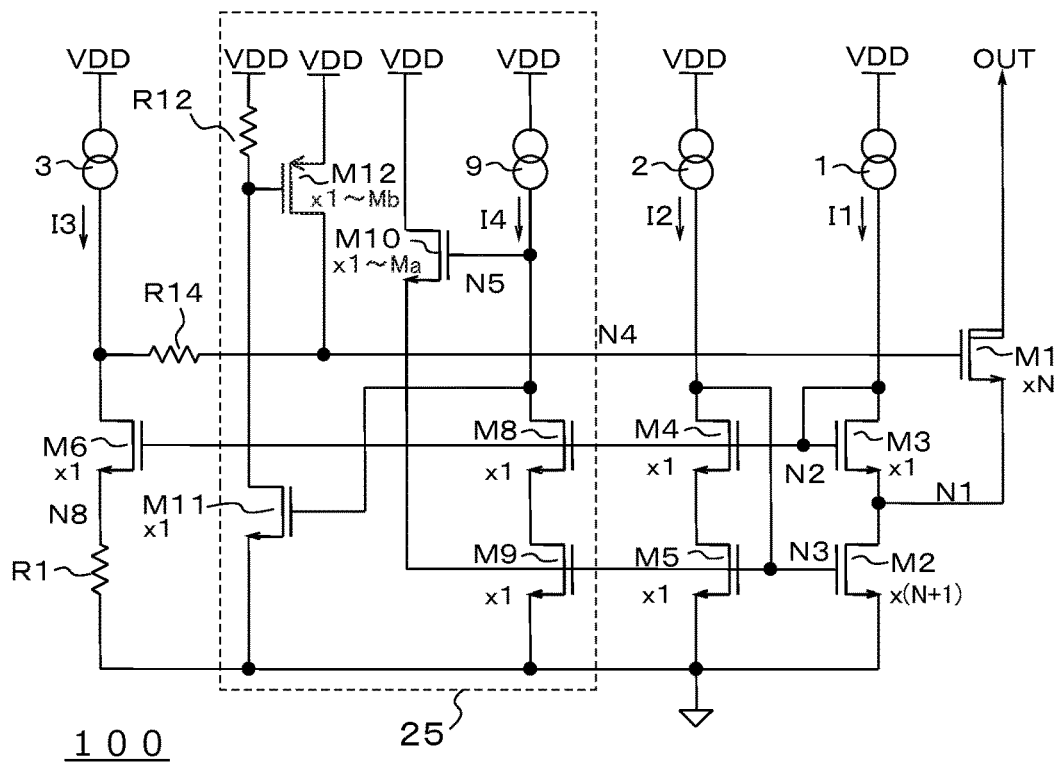
FIG. 11 is a circuit diagram of a current drive circuit according to a second embodiment.

FIG. 11 is a circuit diagram of the current drive circuit 100 according to the second embodiment. In addition to the configuration of the current drive circuit 100 of FIG. 1A, the current drive circuit 100 of FIG. 11 includes eighth to twelfth transistors M8 to M12, a fourth current source 9, and a resistor R1. A relation of connection between the eighth to twelfth transistors M8 to M12, the fourth current source 9, and the resistor R1 is similar to the relation of connection of the case illustrated in FIG. 6 so that the details will not be described herein.

The resistance of the resistor R1 is set to a value obtained by dividing a static potential of a node N1 by a current I3 output from a third current source 3. A current ratio between a current I2 output from a second current source 2 and the current I3 output from the third current source 3 is set to a current mirror ratio of a fourth transistor M4 and a sixth transistor M6.

A third transistor M3, the fourth transistor M4, and a fifth transistor M5 of FIG. 11 are included in a gate voltage generating circuit of a second transistor M2. Furthermore, the sixth transistor M6, a resistor R1, and the third current source 3 are included in a gate voltage generating circuit of a first transistor M1.

Figure 12:
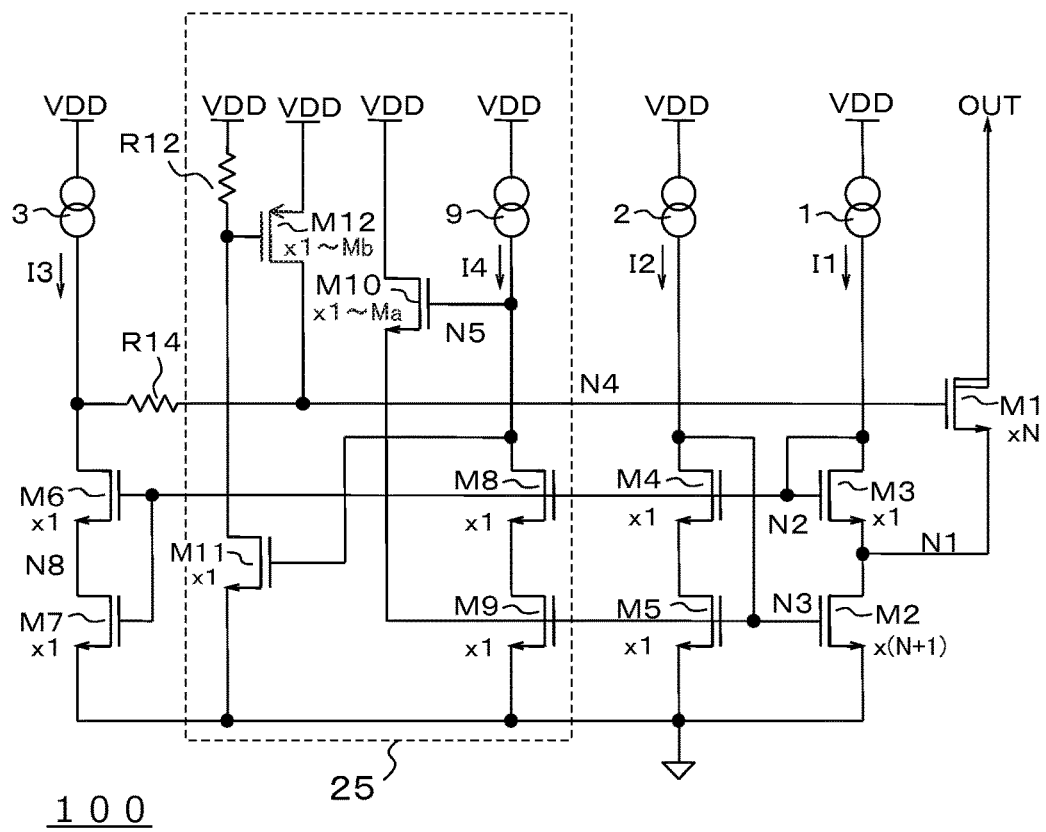
FIG. 12 is a circuit diagram according to a modification of the current drive circuit according to the second embodiment.

FIG. 12 is a circuit diagram of the current drive circuit 100 according to a modification of FIG. 11. The current drive circuit 100 of FIG. 12 includes the seventh transistor M7 in place of the resistor R1 of FIG. 11. A relation of connection of the seventh transistor M7 is similar to that in FIG. 2A.

A current ratio between the current I2 output from the second current source 2 and the current I3 output from the third current source 3 is set according to a ratio of a gate width W to a gate length L (W/L ratio) of the fourth transistor M4 and a W/L ratio of the sixth transistor M6. Similarly, a W/L ratio of the fifth transistor M5 and that of the seventh transistor M7 are also set to the same ratio. By adjusting this ratio, a gate voltage of the first transistor M1 is adjusted and a drain current of the first transistor M1 (output current of the current drive circuit 100) is adjusted. An output current Iout is obtained by multiplying the current I2 output from the second current source 2 by a current mirror ratio of the fifth transistor M5 and the second transistor M2 (W2/L2)/(W5/L5) and by subtracting the current I1 output from the first current source 1 from the product, as represented by the following formula (1).

$$Iout = I2 \times (W2/L2)/(W5/L5) - I1 \qquad (1)$$

The eighth to tenth transistors M8 to M10 in FIGS. 11 and 12 are included in a part of a startup assist circuit 25 and are configured to speedily start up a gate voltage of the second transistor M2. The startup assist circuit 25 illustrated in FIGS. 11 and 12 has a basically similar configuration to the circuit of FIG. 6 and includes, for example, the eighth to twelfth transistors M8 to M12, and the fourth current source 9. A gate of the tenth transistor M10 is connected to a node N5, and a drain thereof is connected to a node N3. In this manner, the node N3 serves as a source follower output, and a potential of the node N3 is set to a predetermined potential by the tenth transistor M10 at the time of startup.

A current mirror ratio of the current I4 output from the fourth current source 9 to the current I2 output from the second current source 2 is set to the same value as W/L ratio of the eighth transistor M8 and the fourth transistor M4 and W/L ratio of the ninth transistor M9 and the fifth transistor M5.

Figure 13:
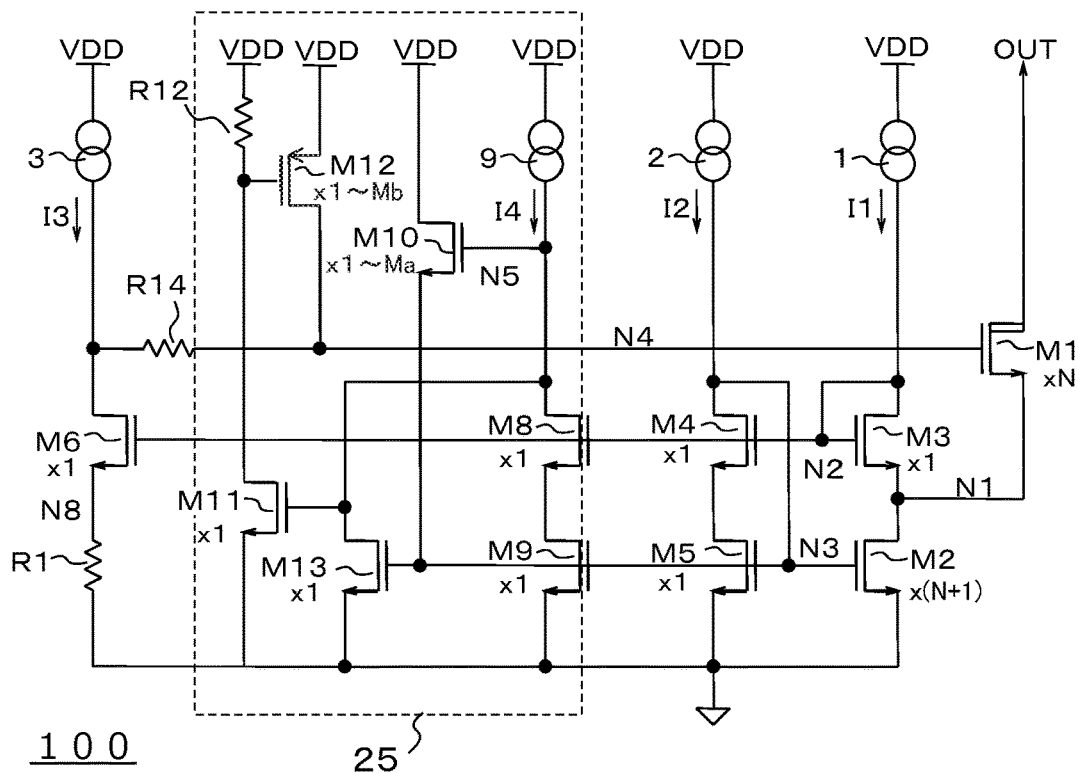
FIG. 13 is a circuit diagram of the current drive circuit according to the second embodiment with a thirteenth transistor added.
Figure 14:
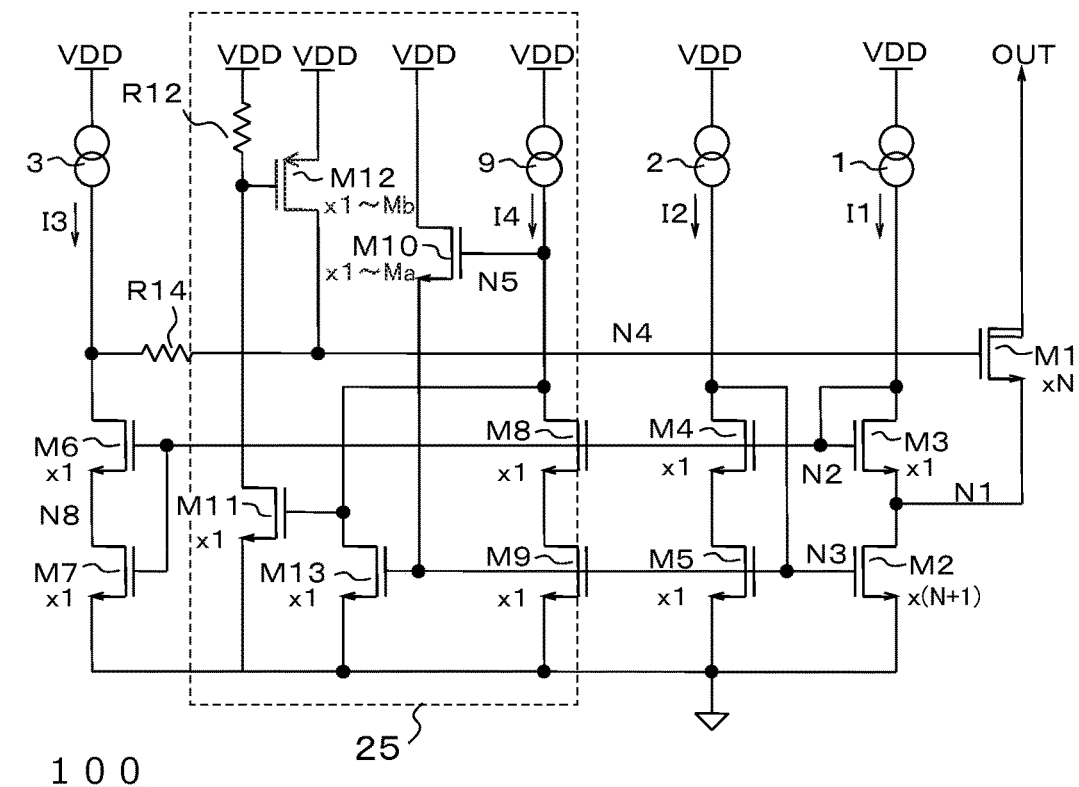
FIG. 14 is another circuit diagram of the current drive circuit according to the second embodiment with the thirteenth transistor added.

FIGS. 13 and 14 are circuit diagrams of the current drive circuit 100 illustrated in FIGS. 11 and 12 with a thirteenth transistor M13 added. The thirteenth transistor M13 shares the gate with the second transistor M2. A drain of the thirteenth transistor M13 is connected to the node N5, and a source thereof is connected to the ground node.

The thirteenth transistor M13 makes it possible to clamp the potential of the node N5 so as not to raise the potential up to 2 Vth or more, which can restrict the operation of the tenth transistor M10.

The eleventh transistor M11 illustrated in FIGS. 11 to 14 is included in a part of the startup assist circuit 25 that speedily starts up the gate voltage of the first transistor M1. A gate of the eleventh transistor M11 is connected to the node N5, the source thereof is connected to the ground node, and a drain thereof is connected to the gate of the twelfth transistor M12. The twelfth transistor M12 is a MOS transistor having a polarity (for example, p type) opposite to that of the first to eleventh transistors M1 to M11. A source of the twelfth transistor M12 is connected to the power supply voltage node VDD, and a drain thereof is connected to a node N4.

A circuit for turning on the twelfth transistor M12 may be provided in a separate manner. For example, a pulse signal outputted from the pulse generating circuit 30 of FIG. 10A or a pulse signal using the potential of the node N5 may be applied to the gate of the twelfth transistor M12.

(Operation of Second Transistor M2 in Off State)

Figure 15B:
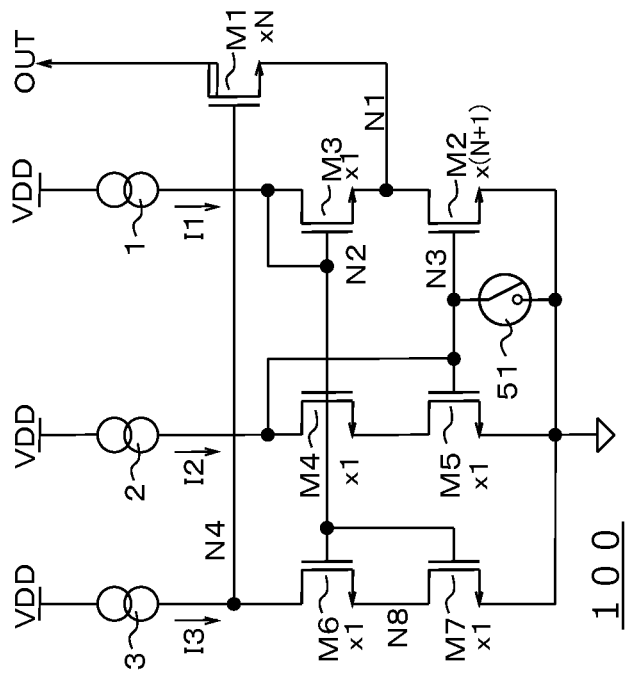
FIGS. 15A and 15B are views for explaining operation of a second transistor according to the first and second embodiments in the off state and the on state.
Figure 15A:
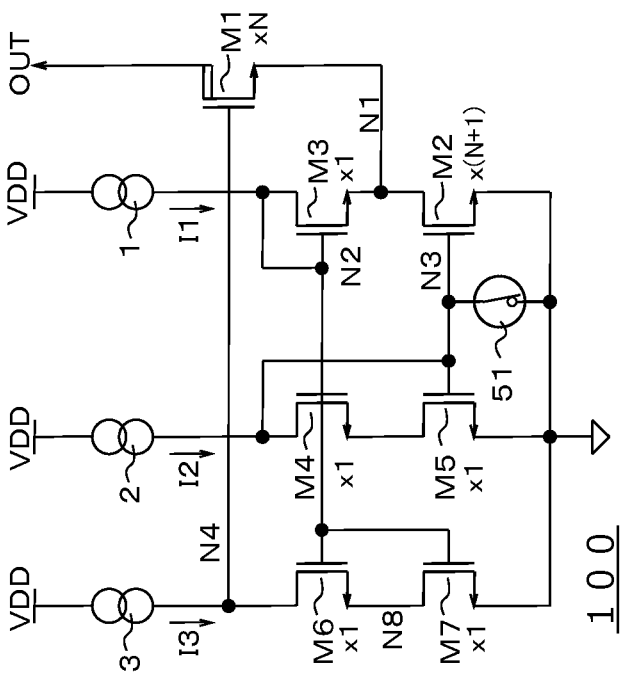

When the drain voltage of the first transistor M1 decreases, the current I1 from the first current source 1 should be prevented from flowing to an OUT terminal from a drain of the first transistor M1. To prevent this inflow, as illustrated in FIGS. 15A and 15B, a first changeover switch 51 may be connected between the node N3 linked to the gate of the second transistor M2 and the ground node. FIG. 15A illustrates the second transistor M2 in the off state, and FIG. 15B illustrates the second transistor M2 in the on state. When the second transistor M2 is in the off state, the first changeover switch 51 electrically connects the node N3 and the ground node as illustrated in FIG. 15A. When the second transistor M2 is in the on state, the node N3 is blocked from the ground node as illustrated in FIG. 15B.

Figure 16A:
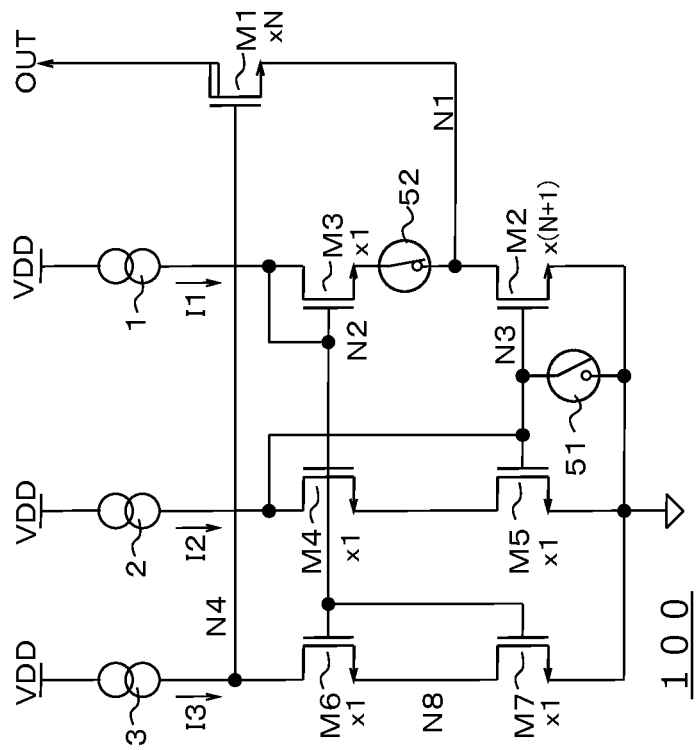
FIGS. 16A and 16B are circuit diagrams according to a modification of FIGS. 15A and 15B.
Figure 16B:
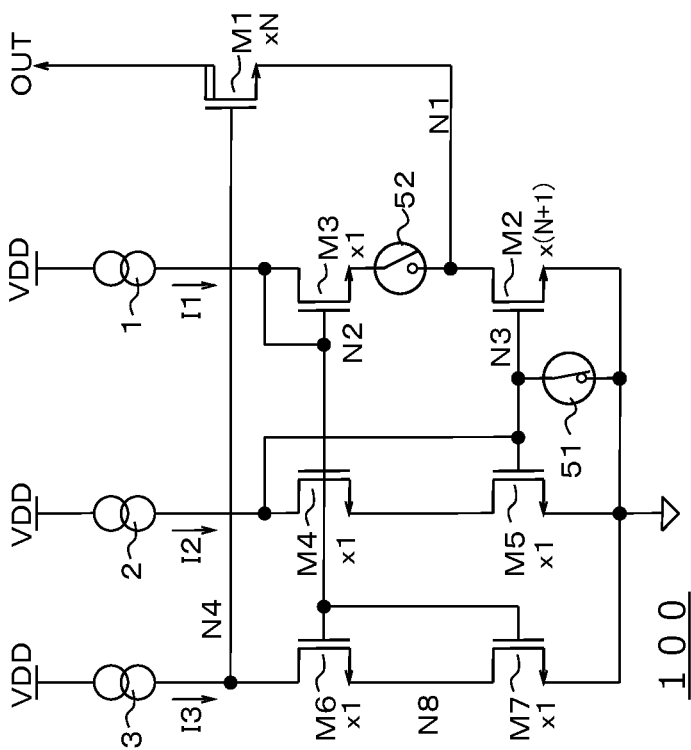

In order to reliably prevent the current I1 from the first current source 1 from flowing to the OUT terminal from the drain of the first transistor M1 when the drain voltage of the first transistor M1 decreases, a circuit illustrated in FIGS. 16A and 16B or FIGS. 17A and 17B may be employed. In FIGS. 16A and 16B, in addition to the first changeover switch 51 in FIGS. 15A and 15B, a second changeover switch 52 is interposed between a source of the third transistor M3 and the node N1. FIG. 16A illustrates the second transistor M2 in the off state, and FIG. 16B illustrates the second transistor M2 in the on state.

When the second transistor M2 is in the on state, the second changeover switch 52 electrically connects a drain of the second transistor M2 to the node N1 as illustrated in FIG. 16B. Meanwhile, when the second transistor M2 is in the off state, the second changeover switch 52 blocks the connection between the source of the third transistor M3 and the node N1. Accordingly, when the second transistor M2 is in the off state, the current I1 from the first current source 1 is prevented from flowing to the OUT terminal through the node N1.

Figure 17A:
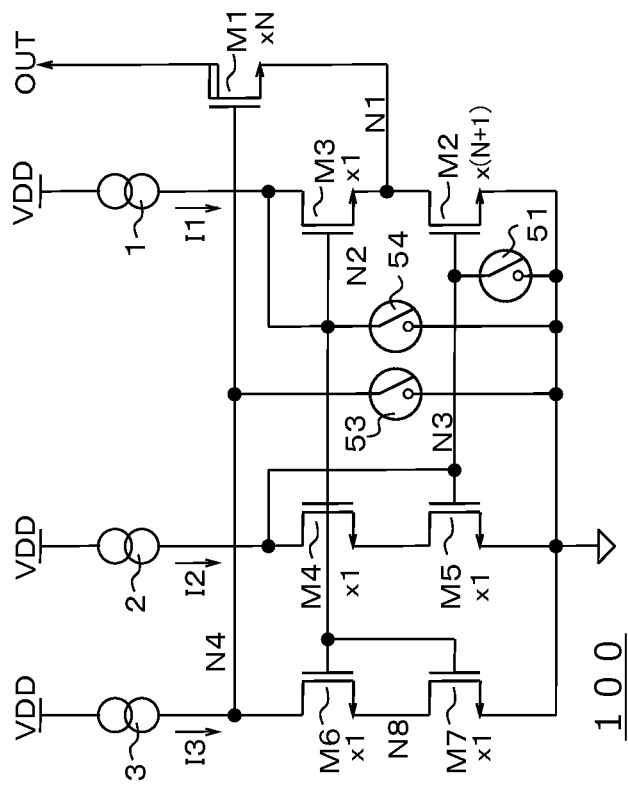
FIGS. 17A and 17B are circuit diagrams according to another modification of FIGS. 15A and 15B.
Figure 17B:
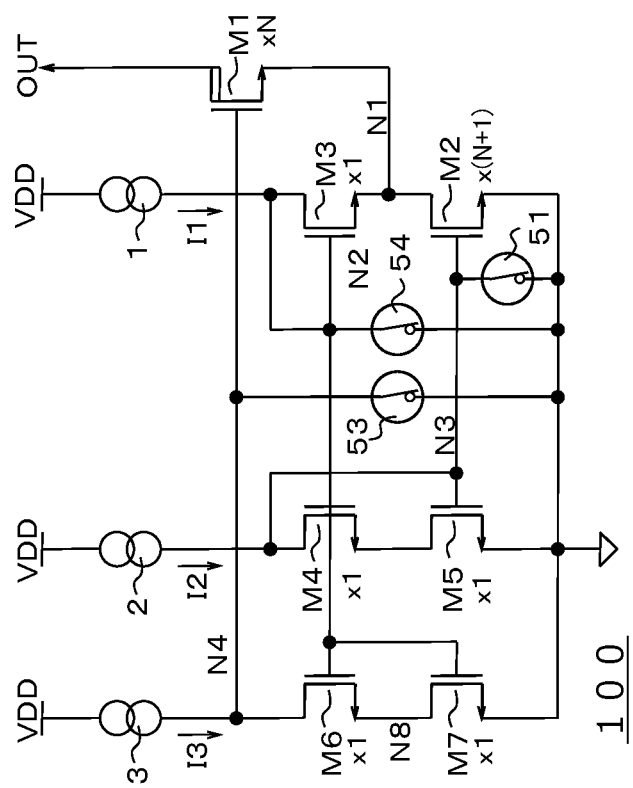

The current drive circuit 100 in FIGS. 17A and 17B includes a third changeover switch 53 and a fourth changeover switch 54 in place of the second changeover switch 52 in FIGS. 16A and 16B. The third changeover switch 53 is interposed between the node N4 linked to the gate of the first transistor M1 and the ground node. The fourth changeover switch 54 is interposed between the node N2 linked to the gate of the third transistor M3 and the ground node. FIG. 17A illustrates the second transistor M2 in the off state, and FIG. 17B illustrates the second transistor M2 in the on state.

When the second transistor M2 is in the on state, the third changeover switch 53 blocks the connection between the node N4 linked to the gate of the first transistor M1 and the ground node. The fourth changeover switch 54 blocks the connection between the node N2 linked to the gate of the third transistor M3 and the ground node. Meanwhile, when the second transistor M2 is in the off state, the third changeover switch 53 electrically connects the node N4 linked to the gate of the first transistor M1 to the ground node. The fourth changeover switch 54 electrically connects the node N2 linked to the gate of the third transistor M3 to the ground node. Accordingly, the second transistor M2 and the third transistor M3 are turned off with certainty, which eliminates the possibility that the current I1 from the first current source 1 flows into the OUT terminal through the node N1.

Figure 18A:
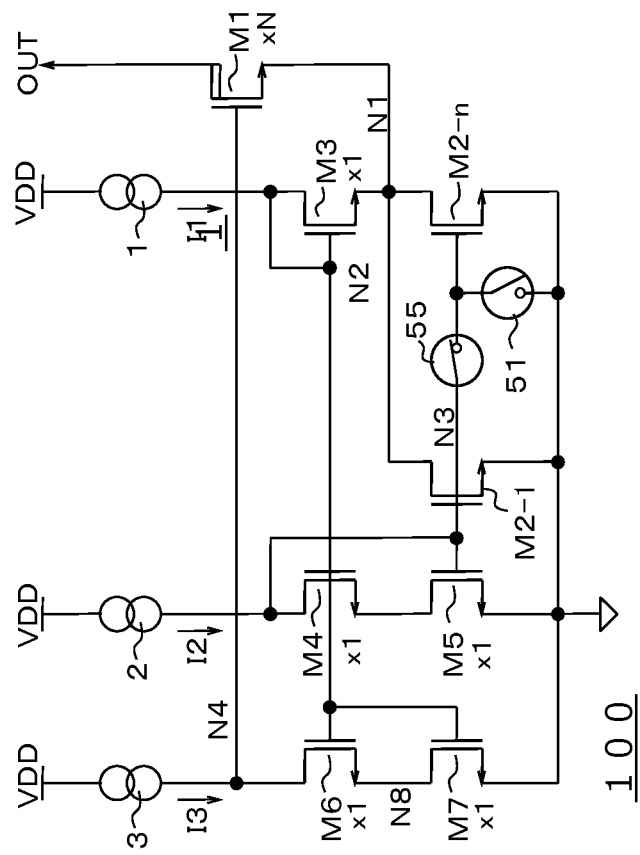
FIGS. 18A and 18B are equivalent circuit diagrams when the second transistor according to the first and second embodiments is divided into a same-size portion and an N-times portion.
Figure 18B:
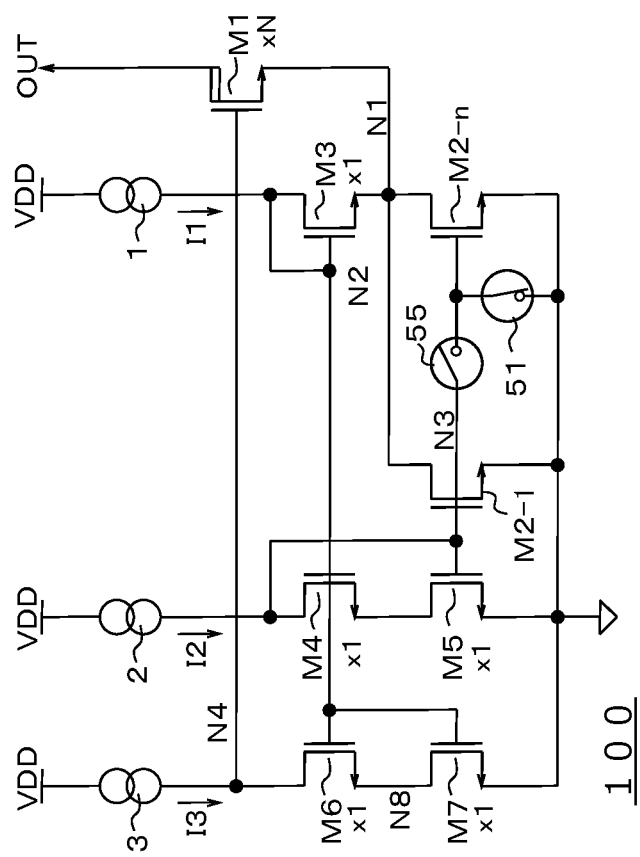

In the current drive circuit 100 of FIGS. 11 to 14, the second transistor M2 has (1+N) times the size of the third to thirteenth transistors M3 to M13 all of which have a low withstand voltage. The second transistor M2 is mountable on the current drive circuit 100 by being divided into a same-size portion M2-1 having the same size as the third to thirteenth transistors M3 to M13 and an N-times portion M2-N having N times the size of the third to thirteenth transistors M3 to M13. FIGS. 18A and 18B are equivalent circuit diagrams in which the second transistor M2 is divided into the same-size portion M2-1 and the N-times portion M2-N. FIG. 18A illustrates the equivalent circuit diagram of the second transistor M2 in the off state, and FIG. 18B illustrates the equivalent circuit diagram of the second transistor M2 in the on state. This equivalent circuit includes the first changeover switch 51 interposed between a gate of the N-times portion M2-N and the ground node; and a fifth changeover switch 55 interposed between a gate of the same-size portion M2-1 and the gate of the N-times portion M2-N.

When the second transistor M2 is in the off state, as illustrated in FIG. 18A, the fifth changeover switch 55 is in the off state, and the gate of the same-size portion M2-1 is connected to the node N3, but the gate of the N-times portion M2-N is blocked from the node N3. In addition, the first changeover switch 51 is turned on to connect the gate of the N-times portion M2-N to the ground node. Accordingly, a gate voltage of the N-times portion M2-N is completely discharged, and the N-times portion M2-N is turned off. Since the same-size portion M2-1 operates, the current I1 flowing from the first current source 1 to the node N1 flows through the same-size portion M2-1 to the ground node.

When the second transistor M2 is in the on state, the fifth changeover switch 55 is turned on, and the first changeover switch 51 is turned off as illustrated in FIG. 18B. Therefore, the drain current of the first transistor M1 flows to the N-times portion M2-N. Furthermore, the current flowing from the first current source 1 to the node N1 flows to the same-size portion M2-1.

As described above, when connecting the startup assist circuit 25 to the node N3 linked to the gate of the second transistor M2, it is desirable that the same-size portion M2-1 is disposed on the input side of the startup assist circuit 25 and that the N-times portion M2-N is disposed on the output side of the startup assist circuit 25.

Figure 19A:
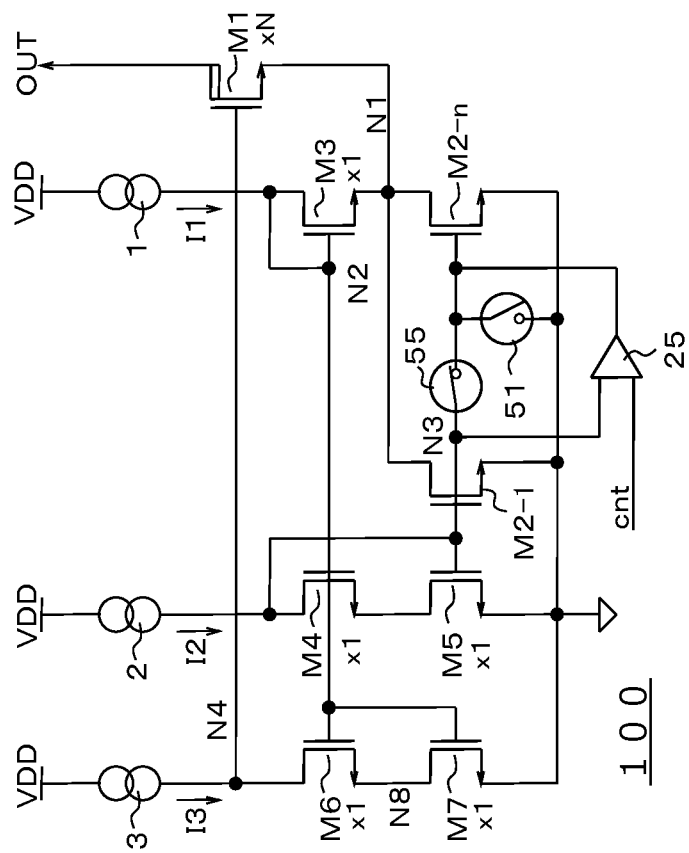
FIGS. 19A and 19B are equivalent circuit diagrams of the current drive circuit according to the embodiment with a startup assist circuit added.
Figure 19B:
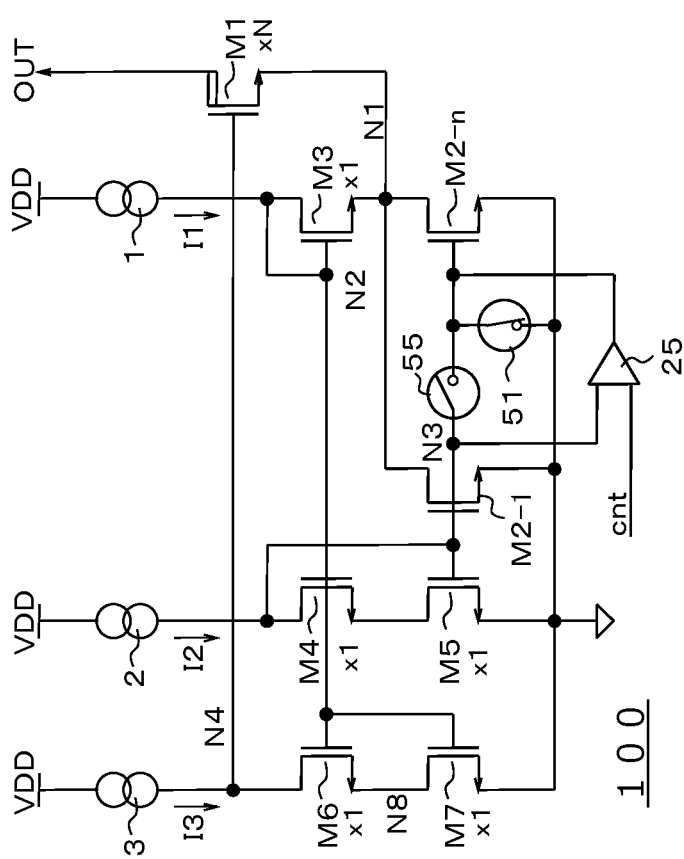

FIGS. 19A and 19B are equivalent circuit diagrams of the circuit illustrated in FIGS. 18A and 18B with the startup assist circuit 25 added. FIG. 19A illustrates the equivalent circuit diagram of the second transistor M2 in the off state, and FIG. 19B illustrates the second transistor M2 in the on state. As illustrated in FIGS. 19A and 19B, a potential of a connection node between the node N3 and the same-size portion M2-1 is input to the startup assist circuit 25. An output signal of the startup assist circuit 25 is input to the gate of the N-times portion M2-N through an input terminal of the startup assist circuit 25. The startup assist circuit 25 assists startup according to a signal cnt. The signal cnt reaches a high level, for example, for a predetermined period from input of a startup signal.

Figure 20A:
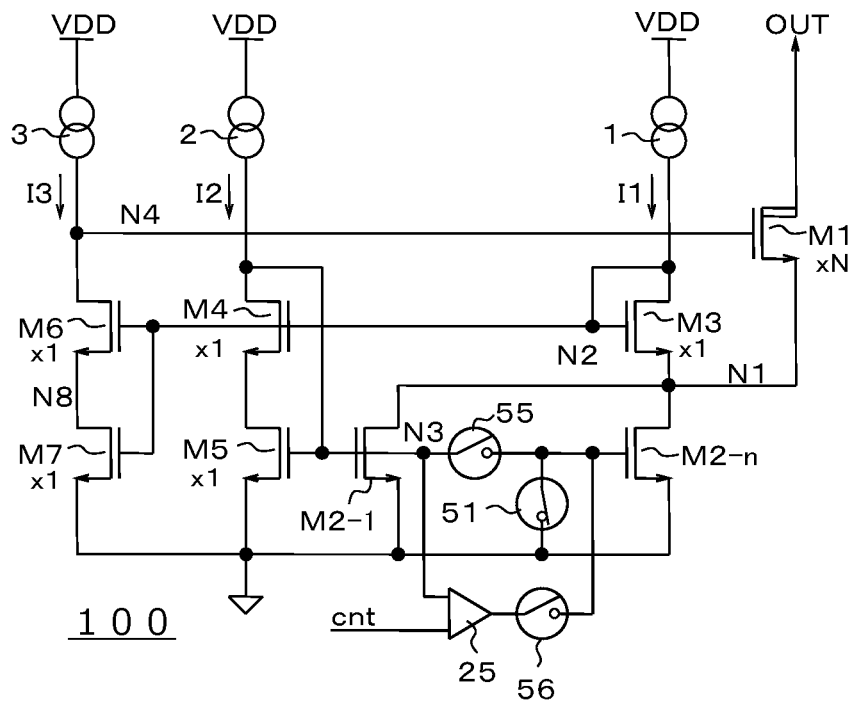
FIG. 20A is a circuit diagram of the current drive circuit 100 in which a sixth changeover switch is interposed between an output node of the startup assist circuit illustrated in FIGS. 19A and 19B and a gate of the second transistor.
Figure 20B:
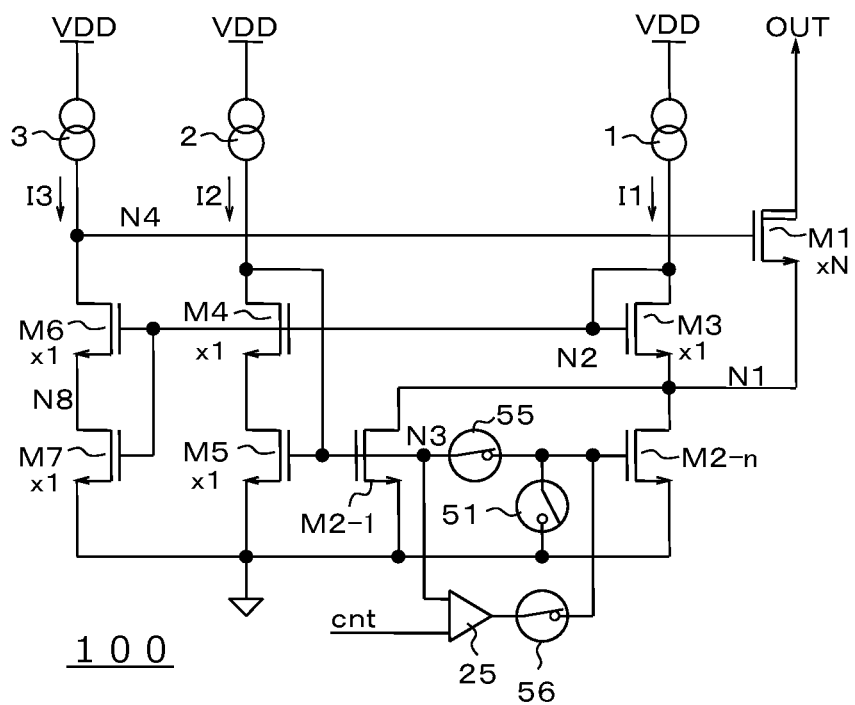
FIG. 20B is a circuit diagram of the current drive circuit 100 in which the sixth changeover switch is interposed between the output node of the startup assist circuit illustrated in FIGS. 19A and 19B and the gate of the second transistor.
Figure 20C:
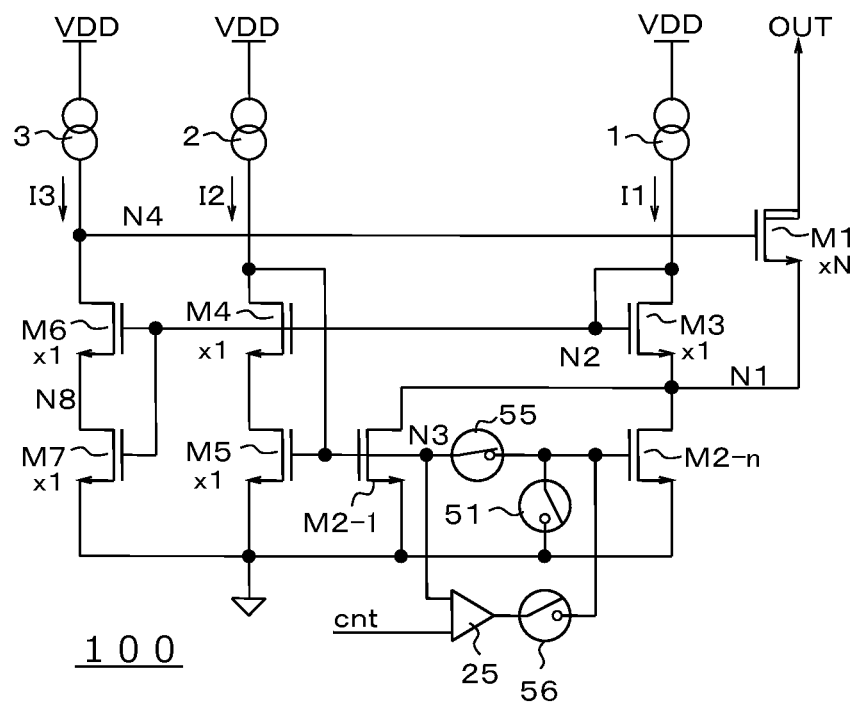
FIG. 20C is a circuit diagram of the current drive circuit 100 in which the sixth changeover switch is interposed between the output node of the startup assist circuit illustrated in FIGS. 19A and 19B and the gate of the second transistor.

FIGS. 20A, 20B, and 20C are circuit diagrams of the current drive circuit 100 in which a sixth changeover switch 56 is interposed between an output node of the startup assist circuit 25 in FIGS. 19A and 19B and the gate of the second transistor M2. In the circuit illustrated in FIGS. 20A to 20C, the gate of the second transistor M2 is driven, using potentials of both the startup assist circuit 25 and the node N3 at the time of startup. FIG. 20A illustrates the second transistor M2 in the off state, FIG. 20B illustrates the second transistor M2 at the time of startup, and FIG. 20C illustrates the second transistor M2 in the on state after startup. The startup assist circuit 25 illustrated in FIGS. 20A to 20C includes the first changeover switch 51 and the fifth changeover switch 55 similar to one illustrated in FIGS. 19A and 19B. The sixth changeover switch 56 illustrated in FIGS. 20A to 20C switches connection states, determining whether to electrically connect the output node of the startup assist circuit 25 and the gate of the second transistor M2. When the second transistor M2 is in the off state, as illustrated in FIG. 20A, the first changeover switch 51 electrically connects the gate of the second transistor M2 to the ground node. In addition, the fifth changeover switch 55 and the sixth changeover switch 56 are opened, and the second transistor M2 is completely turned off. With the second transistor M2 at the time of startup, as illustrated in FIG. 20B, the first changeover switch 51 blocks the connection between the gate of the second transistor M2 and the ground node. The fifth changeover switch 55 connects the node N3 and the gate of the second transistor M2. The sixth changeover switch 56 connects the output node of the startup assist circuit 25 to the gate of the second transistor M2.

Accordingly, the second transistor M2 is started up at a high speed. When the second transistor M2 is in the on state after startup, as illustrated in FIG. 20C, the first changeover switch 51 and the sixth changeover switch 56 are opened, and the fifth changeover switch 55 connects the node N3 and the gate of the second transistor M2.

Accordingly, the startup assist circuit 25 is disconnected, and the second transistor M2 operates based on the potential of the node N3.

Figure 21A:
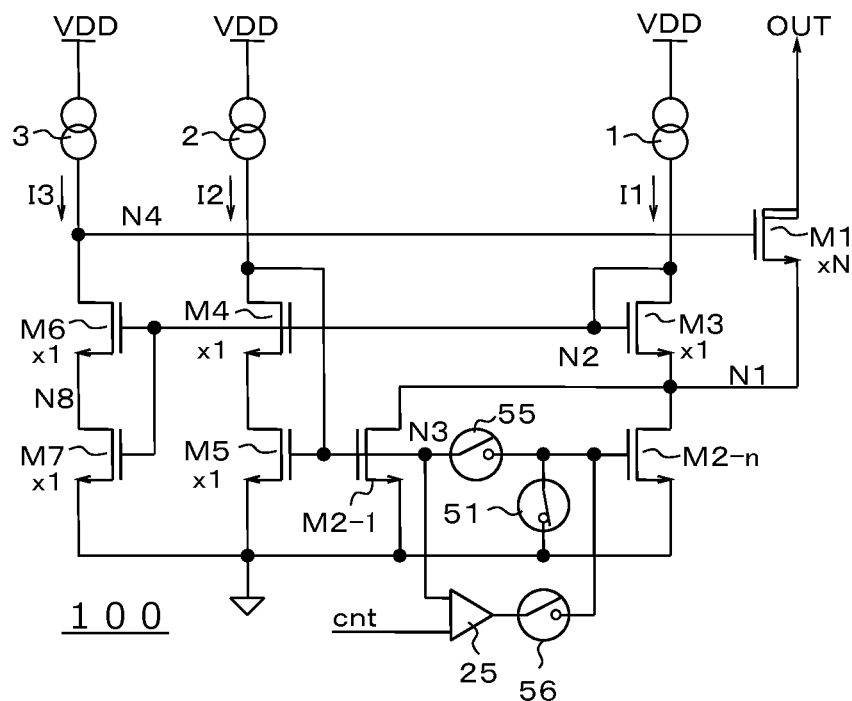
FIG. 21A is a circuit diagram of the current drive circuit 100 that drives the gate of the second transistor with the startup assist circuit at the time of startup.
Figure 21B:
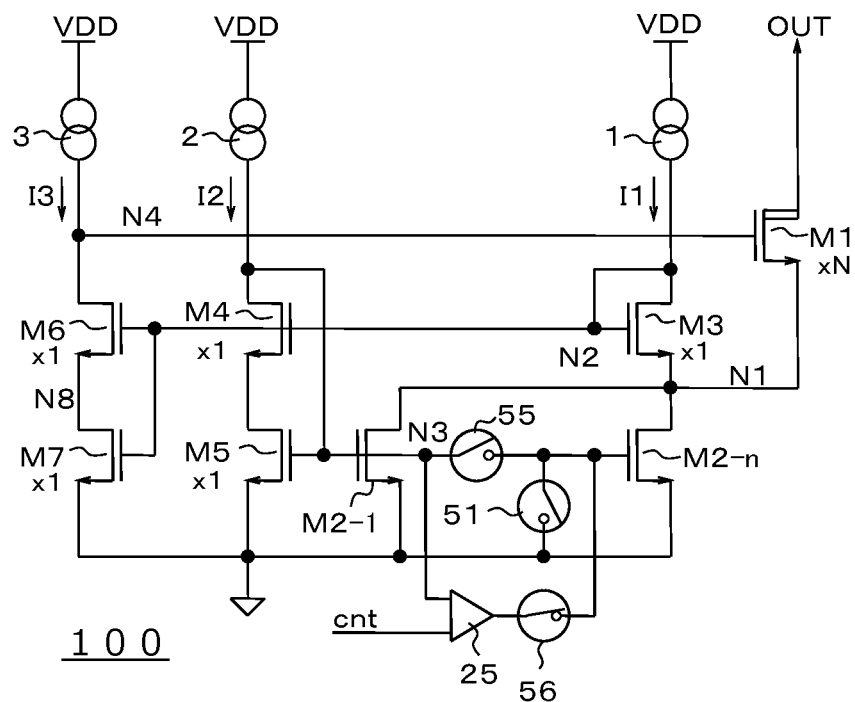
FIG. 21B is a circuit diagram of the current drive circuit 100 that drives the gate of the second transistor with the startup assist circuit at the time of startup.
Figure 21C:
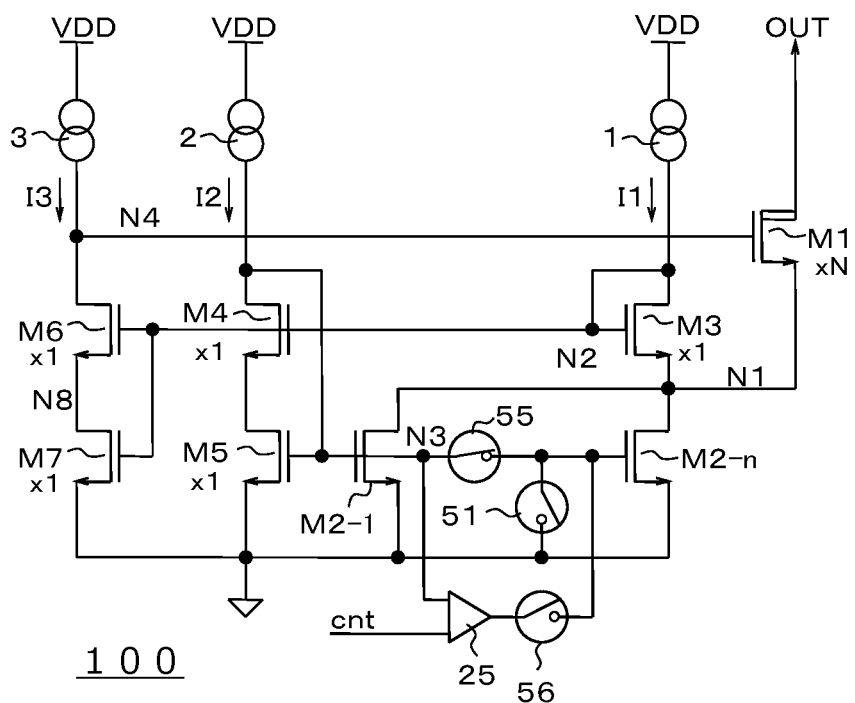
FIG. 21C is a circuit diagram of the current drive circuit 100 that drives the gate of the second transistor with the startup assist circuit at the time of startup.

Unlike FIGS. 20A to 20C, FIGS. 21A, 21B, and 21C are circuit diagrams of the current drive circuit 100 that drives the gate of the second transistor M2 with the startup assist circuit 25 at the time of startup. FIGS. 21A to 21C each illustrate a configuration of the circuit illustrated in FIGS. 19A and 19B with the sixth changeover switch 56 added. FIG. 21A illustrates the second transistor M2 in the off state, FIG. 21B illustrates the second transistor M2 at the time of startup, and FIG. 21C illustrates the second transistor M2 in the on state. The circuit illustrated in FIGS. 21A to 21C is different from the circuit illustrated in FIGS. 20A to 20C in that the fifth changeover switch 55 is opened at the time of startup. At the time of startup, the output node of the startup assist circuit 25 is connected to the gate of the N-times portion M2-N, and the output node of the startup assist circuit 25 is not connected to the gate of the same-size portion M2-1.

Figure 22A:
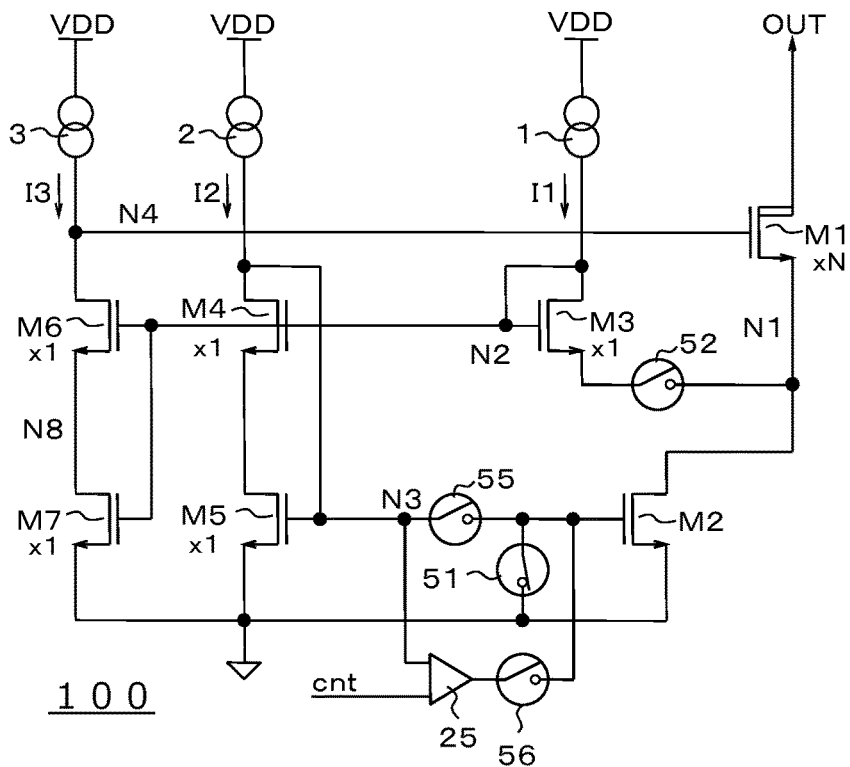
FIG. 22A is a circuit diagram of the current drive circuit 100 that drives the gate of the second transistor, using potentials of both the startup assist circuit and a node N3 at the time of startup when the second transistor M2 is not divided into the same-size portion and the N-times portion.
Figure 22B:
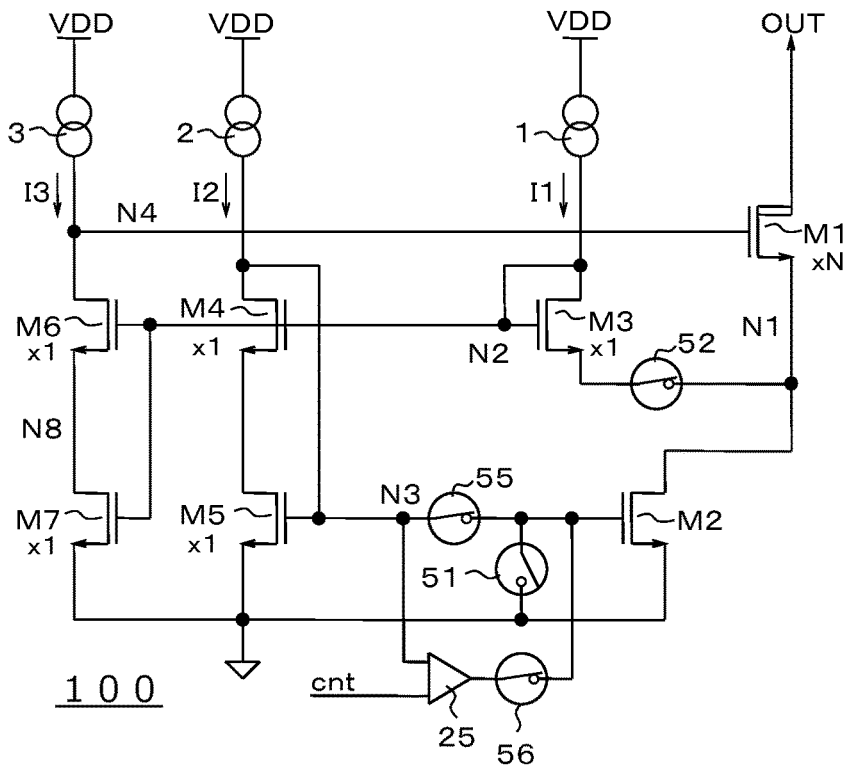
FIG. 22B is a circuit diagram of the current drive circuit 100 that drives the gate of the second transistor, using potentials of both the startup assist circuit and the node N3 at the time of startup when the second transistor M2 is not divided into the same-size portion and the N-times portion.
Figure 22C:
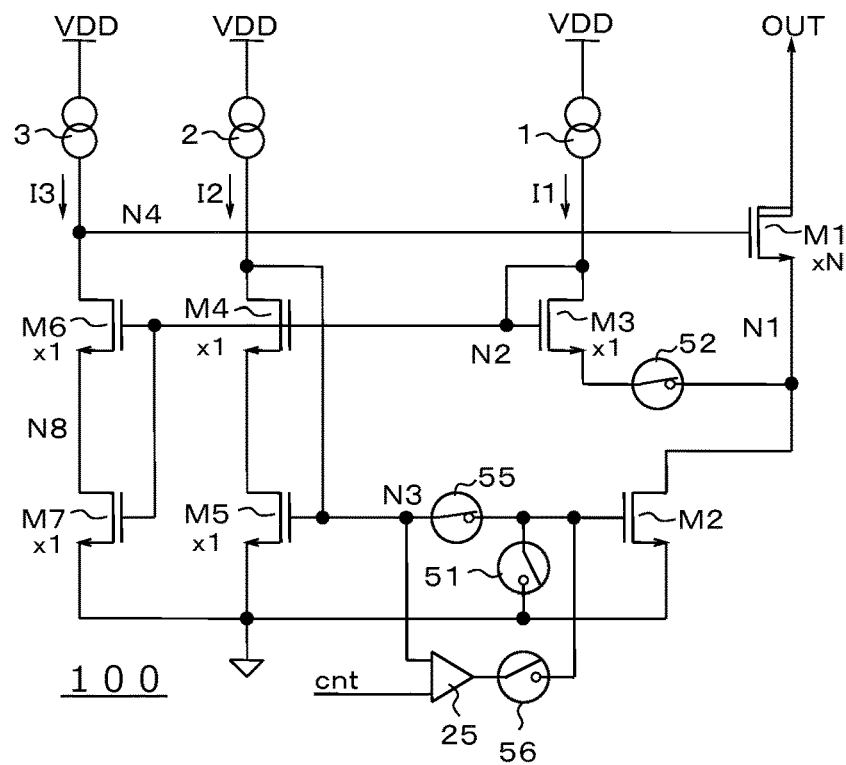
FIG. 22C is a circuit diagram of the current drive circuit 100 that drives the gate of the second transistor, using potentials of both the startup assist circuit and the node N3 at the time of startup when the second transistor M2 is not divided into the same-size portion and the N-times portion.

FIGS. 22A, 22B, and 22C are circuit diagrams of the current drive circuit 100 that drives the gate of the second transistor M2, using potentials of both the startup assist circuit 25 and the node N3 at the time of startup when the second transistor M2 is not divided into the same-size portion M2-1 and the N-times portion M2-N.

FIG. 22A illustrates the second transistor M2 in the off state, FIG. 22B illustrates the second transistor M2 at the time of startup, and FIG. 22C illustrates the second transistor M2 in the on state. The switching states of the first, second, and sixth changeover switches 51, 52, and 56 in FIGS. 22A to 22C are similar to those in FIGS. 20A to 20C.

Figure 23A:
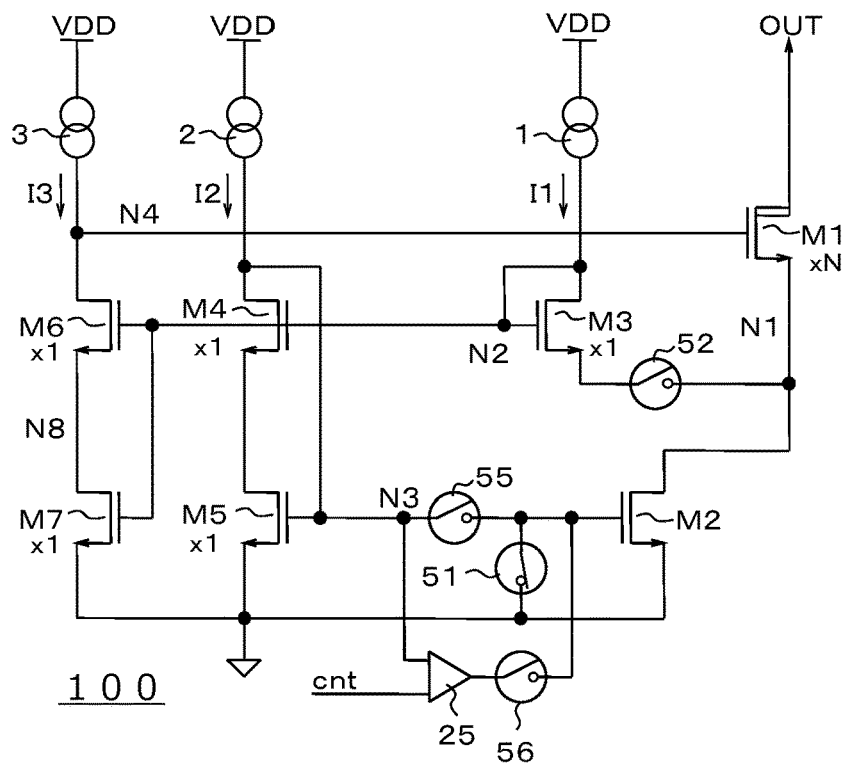
FIG. 23A is a circuit diagram of the current drive circuit 100 that drives the gate of the second transistor, using potentials of both the startup assist circuit and the node N3 at the time of startup when the second transistor M2 is not divided into the same-size portion and the N-times portion.
Figure 23B:
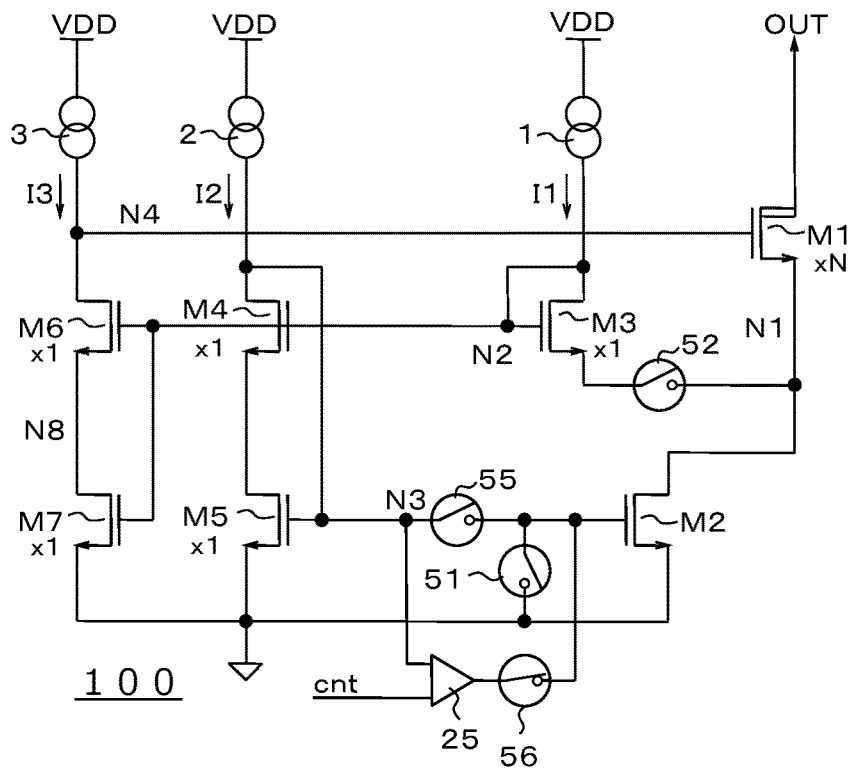
FIG. 23B is a circuit diagram of the current drive circuit 100 that drives the gate of the second transistor, using potentials of both the startup assist circuit and the node N3 at the time of startup when the second transistor M2 is not divided into the same-size portion and the N-times portion.
Figure 23C:
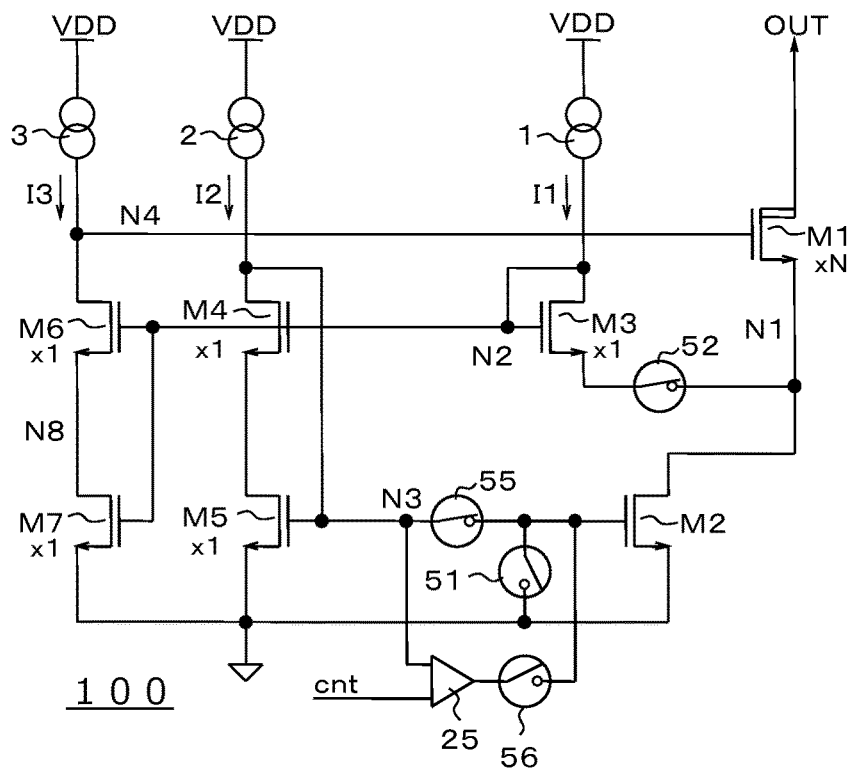
FIG. 23C is a circuit diagram of the current drive circuit 100 that drives the gate of the second transistor, using potentials of both the startup assist circuit and the node N3 at the time of startup when the second transistor M2 is not divided into the same-size portion and the N-times portion.

FIGS. 23A, 23B, and 23C are circuit diagrams of the current drive circuit 100 that drives the gate of the second transistor M2, using potentials of both the startup assist circuit 25 and the node N3 at the time of startup when the second transistor M2 is not divided into the same-size portion M2-1 and the N-times portion M2-N.

FIG. 23A illustrates the second transistor M2 in the off state, FIG. 23B illustrates the second transistor M2 at the time of startup, and FIG. 23C illustrates the second transistor M2 in the on state. The switching states of the first, second, and sixth changeover switches 51, 52, and 56 in FIGS. 23A to 23C are similar to those in FIGS. 21A to 21C.

(Difference from Circuit of Comparative Example)

Figure 24:
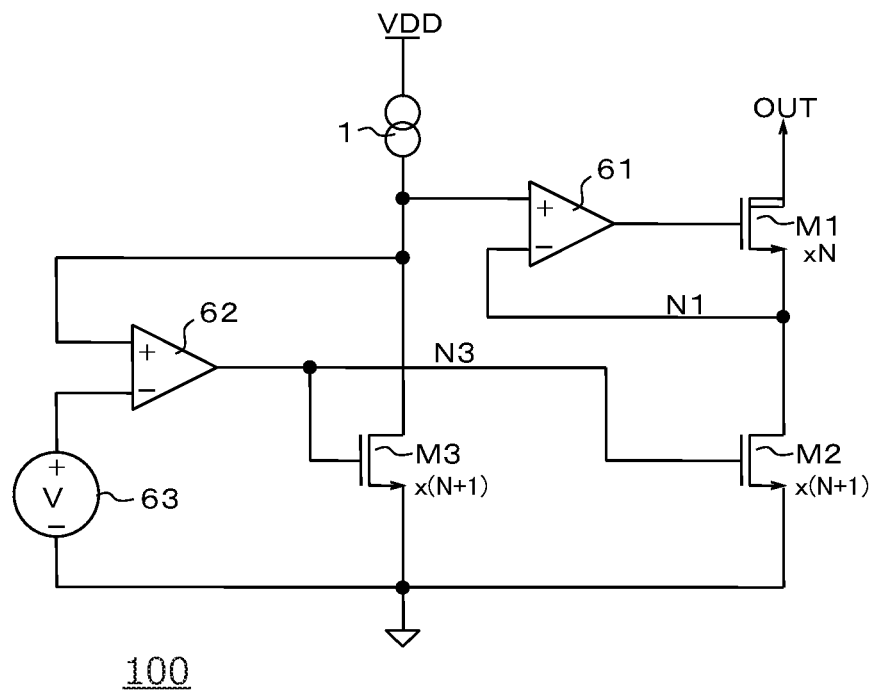
FIG. 24 is a circuit diagram of the current drive circuit 100 according to a comparative example.

FIG. 24 is a circuit diagram of the current drive circuit 100 according to a comparative example. The current drive circuit 100 of FIG. 24 includes a second transistor M2 which has a low withstand voltage and is connected to a first transistor M1 having a high withstand voltage by cascode connection; a third transistor M3; a first current source 1; a first differential amplifier 61; and a second differential amplifier 62. A non-inverting input terminal of the first differential amplifier 61 is connected to a connection node between the first current source 1 and a drain of the third transistor M3. An inverting input terminal of the first differential amplifier 61 is connected to a connection node between the source of the first transistor M1 and a drain of the second transistor M2. An output node of the first differential amplifier 61 is connected to a gate of the first transistor M1. A non-inverting input terminal of the second differential amplifier 62 is connected to a connection node between the first current source 1 and a drain of the third transistor M3. A voltage source 63 that outputs a predetermined voltage is connected to an inverting input terminal of the second differential amplifier 62. An output node of the second differential amplifier 62 is connected to a gate of the second transistor M2.

Figure 25:
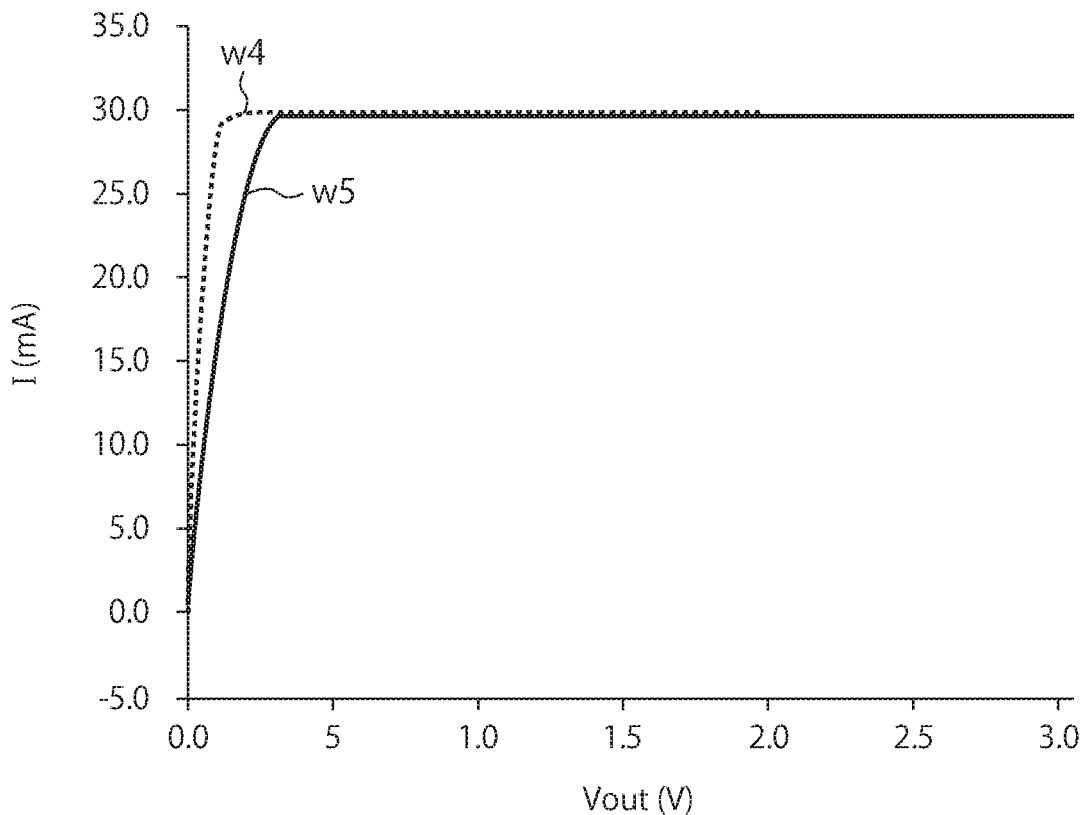
FIG. 25 is a graph illustrating a curve indicating a correspondence relationship between an output voltage output from an OUT terminal linked to a drain of a first transistor and an output current flowing from the OUT terminal.

FIG. 25 is a graph illustrating a curve indicating a correspondence relationship between the output voltage output from the OUT terminal linked to the drain of the first transistor M1 and an output current flowing from the OUT terminal. A curve w4 represents the current drive circuit 100 according to this embodiment, and a curve w5 represents the current drive circuit 100 according to the comparative example illustrated in FIG. 24. The graph shows that the curve w4 has a steeper rising edge than the curve w5 and is excellent in offering a constant current.

Figure 26A:
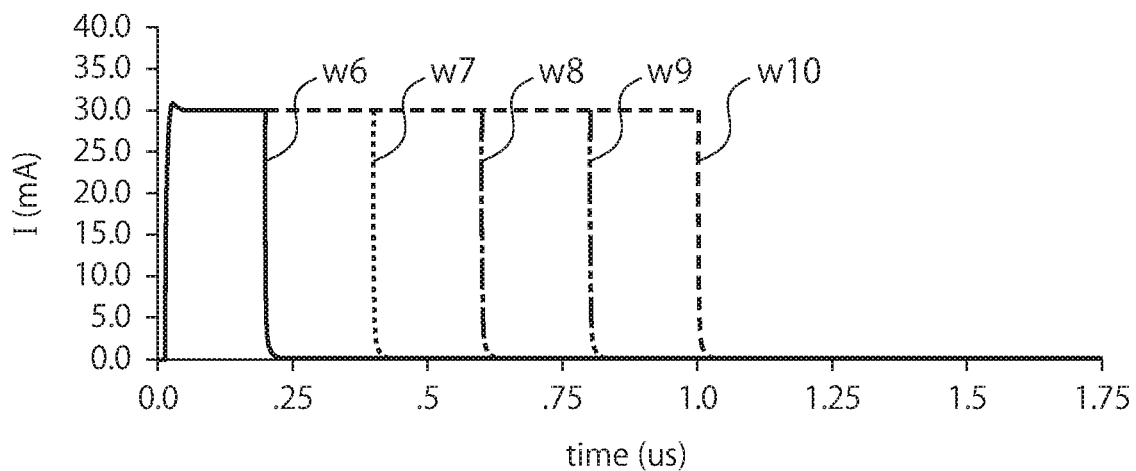
FIGS. 26A and 26B are graphs illustrating the responsiveness of the output current of the current drive circuit 100 according to this embodiment and that of the current drive circuit 100 according to the comparative example.
Figure 26B:
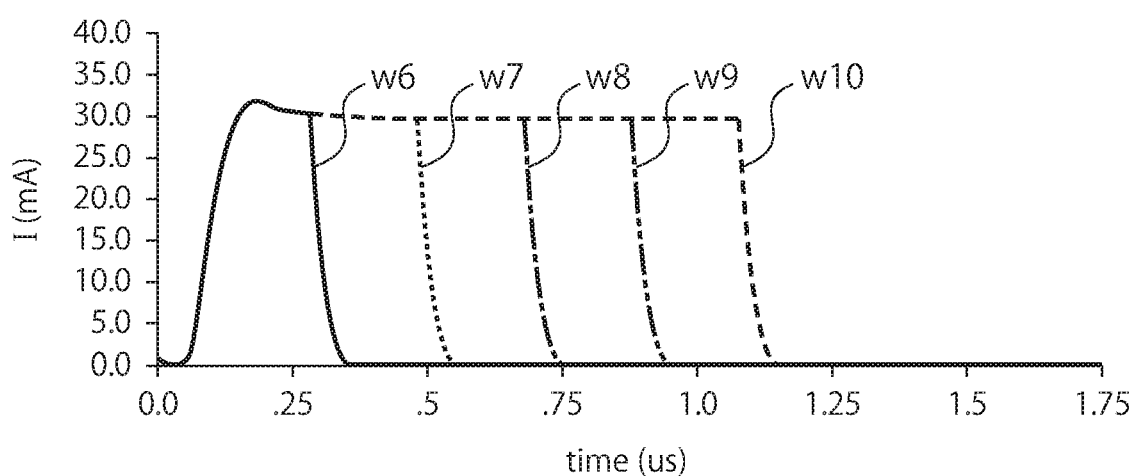

FIGS. 26A and 26B are graphs illustrating the responsiveness of the output current of the current drive circuit 100 according to this embodiment and that of the current drive circuit 100 according to the comparative example. In FIGS. 26A and 26B, the time is taken along the abscissa and the output current is taken along the ordinate. FIGS. 26A and 26B illustrate the responsiveness when the current drive circuit 100 according to this embodiment and the current drive circuit 100 according to the comparative example are pulse-driven for periods of 200 ns, 400 ns, 600 ns, 800 ns, and 1000 ns. Herein, output current waveforms of 200 ns to 1000 ns are denoted by w6 to w10. As seen from the graphs, in this embodiment illustrated in FIG. 26A, the output current becomes constant immediately after startup, whereas in the comparative example illustrated in FIG. 26B, it takes a long time for the output current to be constant. Accordingly, it is clear that the startup time is shorter in this embodiment.

As described above, in the second embodiment, the seventh transistor M7 or the resistor R1 is provided in the current drive circuit 100, which enables adjustment of the gate voltage of the first transistor M1 so that a desired output current is output from the drain of the first transistor M1. Furthermore, in the second embodiment, the eighth to twelfth transistors M8 to M12 are provided in the current drive circuit 100 so that the startup of the second transistor M2 is accelerated. Still further, in the second embodiment, the eleventh transistor M11 is provided in the current drive circuit 100 so that the startup of the first transistor M1 is accelerated.

In the first and second embodiments, the first transistor M1 may be built into the current drive circuit 100, or the first transistor M1 may be externally attached to the current drive circuit 100.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A current drive circuit, comprising:
a first transistor that outputs a current;
a second transistor connected to the first transistor by cascode connection;
a third transistor connected to the second transistor by cascode connection;
a first current source that supplies a current to the third transistor and the second transistor;
a fourth transistor that shares a gate with the third transistor;
a fifth transistor that is connected to the fourth transistor by cascode connection and shares a gate with the second transistor;
a second current source that supplies a current to the fourth transistor and the fifth transistor;
a sixth transistor that shares a gate with the third transistor and the fourth transistor and controls a gate voltage of the first transistor; and
a third current source that supplies a drain current of the sixth transistor.

2. The current drive circuit according to claim 1, wherein the second transistor is larger in size than the third to sixth transistors, and
the current drive circuit further comprises a startup assist circuit that speeds up operation of at least one of the first transistor and the second transistor for a predetermined period from input of a startup signal.

3. The current drive circuit according to claim 2, wherein the first transistor is larger in size than the third to sixth transistors.

4. The current drive circuit according to claim 2, wherein the startup assist circuit is configured to increase a gate current of at least one of the first transistor and the second transistor for the predetermined period from the input of the startup signal.

5. The current drive circuit according to claim 2, wherein the startup assist circuit is configured to increase a gate current of the second transistor for the predetermined period from the input of the startup signal.

6. The current drive circuit according to claim 2, wherein the startup assist circuit is configured to further increase the gate voltage of the first transistor for the predetermined period from the input of the startup signal.

7. The current drive circuit according to claim 2, wherein the startup assist circuit comprises:
a buffer inserted in at least one of a path linked to a gate of the first transistor and a path linked to the gate of the second transistor; and
a switch circuit that drives the buffer during the predetermined period and bypasses the buffer after the predetermined period.

8. The current drive circuit according to claim 2, wherein the predetermined period is from the input of the startup signal to a time when a drain current of the second transistor reaches a predetermined current.

9. The current drive circuit according to claim 1, comprising:
a seventh transistor that is connected to the sixth transistor by cascode connection and shares a gate with the sixth transistor.

10. The current drive circuit according to claim 1, comprising:
a resistor inserted in a path through which the source current of the sixth transistor flows.

11. The current drive circuit according to claim 1, comprising:
an eighth transistor that shares a gate with the third transistor, the fourth transistor, and the sixth transistor;
a ninth transistor that shares a gate with the second transistor and the fifth transistor and is connected to the eighth transistor by cascode connection;
a fourth current source that supplies drain currents of the eighth transistor and the ninth transistor; and
a tenth transistor that controls gate voltages of the second transistor, the fifth transistor, and the ninth transistor based on a voltage of a connection node between the fourth current source and the eighth transistor.

12. The current drive circuit according to claim 11, comprising:
an eleventh transistor that shares a gate with the tenth transistor; and
a twelfth transistor of a conductivity type different from the second to eleventh transistors, being configured to control the gate voltage of the first transistor according to a drain voltage of the eleventh transistor.

13. The current drive circuit according to claim 11, comprising:
a thirteenth transistor that shares a gate with the second transistor, the fifth transistor, and the ninth transistor, to which a drain current from the fourth current source is supplied.

14. The current drive circuit according to claim 1, wherein the first transistor has a withstand voltage higher than withstand voltages of the second to sixth transistors.

15. The current drive circuit according to claim 1, wherein the first transistor outputs a current which is to be applied to a light emitting device.

* * * * *